US011181418B2

(12) United States Patent
Lilic et al.

(10) Patent No.: US 11,181,418 B2
(45) Date of Patent: Nov. 23, 2021

(54) AVALANCHE DIODE ARRANGEMENT AND METHOD FOR CONTROLLING AN AVALANCHE DIODE ARRANGEMENT

(71) Applicant: ams AG, Premstaetten (AT)

(72) Inventors: Nenad Lilic, Premstaetten (AT); Robert Kappel, Premstaetten (AT); Georg Röhrer, Premstaetten (AT)

(73) Assignee: AMS AG, Premstaetten (AT)

( * ) Notice: Subject to any disclaimer, the term of this patent is extended or adjusted under 35 U.S.C. 154(b) by 6 days.

(21) Appl. No.: 16/620,595

(22) PCT Filed: Jun. 19, 2018

(86) PCT No.: PCT/EP2018/066263
§ 371 (c)(1),
(2) Date: Dec. 9, 2019

(87) PCT Pub. No.: WO2018/234309
PCT Pub. Date: Dec. 27, 2018

(65) Prior Publication Data
US 2020/0182692 A1    Jun. 11, 2020

(30) Foreign Application Priority Data

Jun. 23, 2017   (EP) .................... 17177640

(51) Int. Cl.
*G01J 1/44*    (2006.01)
*H01L 31/02*   (2006.01)
*H03K 5/24*    (2006.01)

(52) U.S. Cl.
CPC .......... *G01J 1/44* (2013.01); *H01L 31/02027* (2013.01); *H03K 5/2472* (2013.01); *G01J 2001/442* (2013.01); *G01J 2001/4466* (2013.01)

(58) Field of Classification Search
CPC ................ G01J 1/44; G01J 2001/442; G01J 2001/4466; G01J 2001/444; H01L 31/02027; H03K 5/2472; H03K 5/249
See application file for complete search history.

(56) References Cited

U.S. PATENT DOCUMENTS

| 5,532,474 A | 7/1996 | Dautet et al. |
| 2008/0231339 A1* | 9/2008 | Deschamps ........ H03K 17/6877 327/326 |

(Continued)

FOREIGN PATENT DOCUMENTS

| CN | 103148950 | 6/2013 |
| EP | 2352228 | 8/2011 |

(Continued)

OTHER PUBLICATIONS

Bronzi, D. et al.: "Fast sensing and quenching of CMOS SPADs for minimal afterpulsing effects" IEEE Photonics Technology Letters, vol. 25, No. 8, Apr. 15, 2013, pp. 776-779.

(Continued)

*Primary Examiner* — Thanh Luu
*Assistant Examiner* — Monica T Taba
(74) *Attorney, Agent, or Firm* — MH2 Technology Law Group LLP

(57) ABSTRACT

A avalanche diode arrangement comprises an avalanche diode (11) that is coupled to a first voltage terminal (14) and to a first node (15), a latch comparator (12) with a first input (16) coupled to the first node (15), a second input (17) for receiving a reference voltage (VREF) and an enable input (21) for receiving a comparator enable signal (CLK), and a quenching circuit (13) coupled to the first node (15).

14 Claims, 8 Drawing Sheets

(56) References Cited

U.S. PATENT DOCUMENTS

| | | | |
|---|---|---|---|
| 2013/0334411 A1 | 12/2013 | Brunel et al. | |
| 2014/0167813 A1* | 6/2014 | Raychowdhury | G06F 1/3287 326/33 |
| 2014/0231630 A1 | 8/2014 | Rae et al. | |
| 2016/0084703 A1* | 3/2016 | Shaber | G01T 1/00 250/336.1 |
| 2016/0223397 A1 | 8/2016 | Tsai et al. | |

FOREIGN PATENT DOCUMENTS

| | | | |
|---|---|---|---|
| EP | 3081963 | 10/2016 | |
| GB | 2269010 A * | 1/1994 | G01J 1/44 |

OTHER PUBLICATIONS

Cova, S. et al.: "Avalanche photodiodes and quenching circuits for single-photon detection" Applied Optics, Optical Society of America, Washington, DC; US vol. 35 , No. 12, Apr. 20, 1996 (Apr. 20, 1996), pp. 1956-1976.

European Patent Office, International Search Report for PCT/EP2018/066263 dated Aug. 21, 2018.

\* cited by examiner

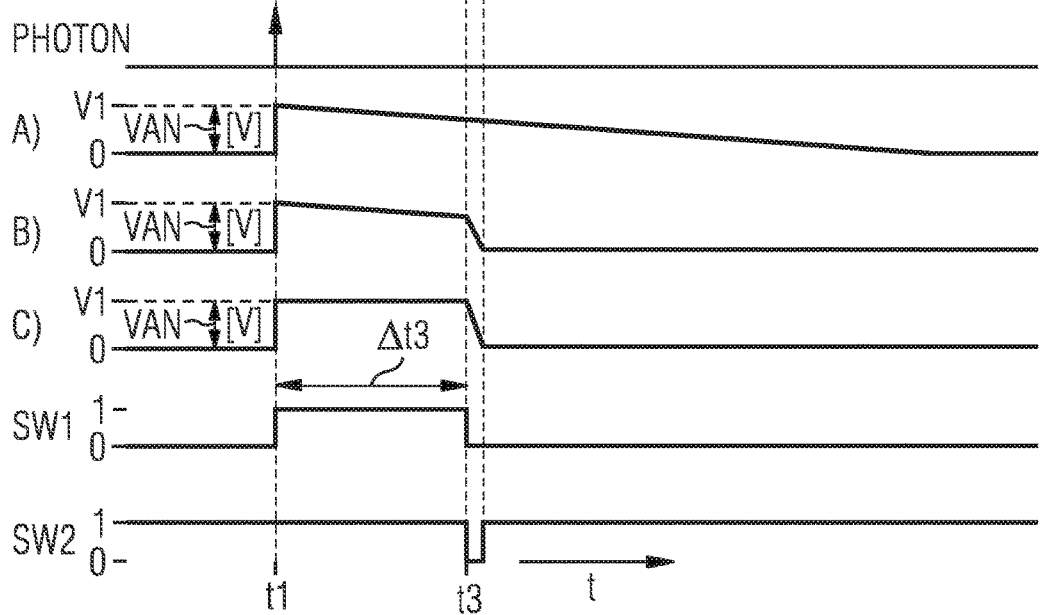
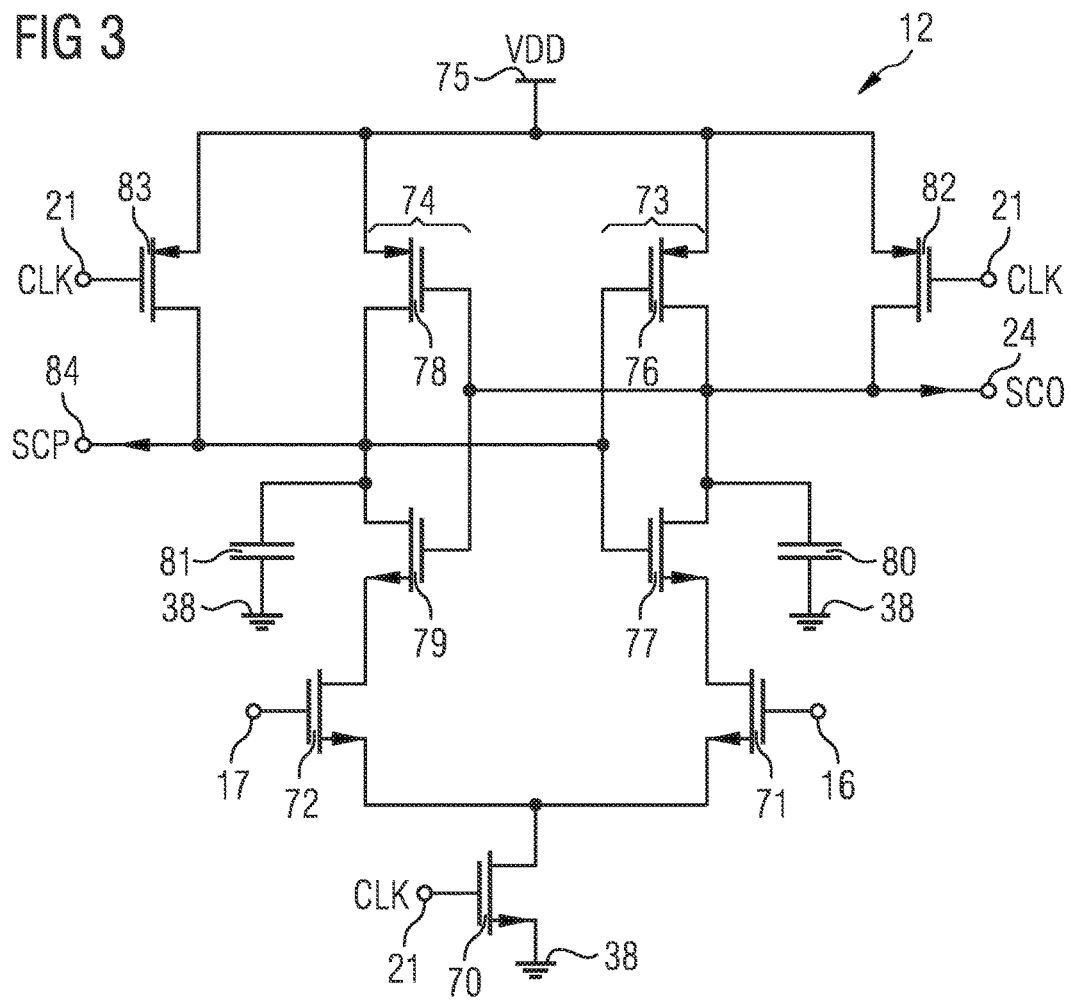

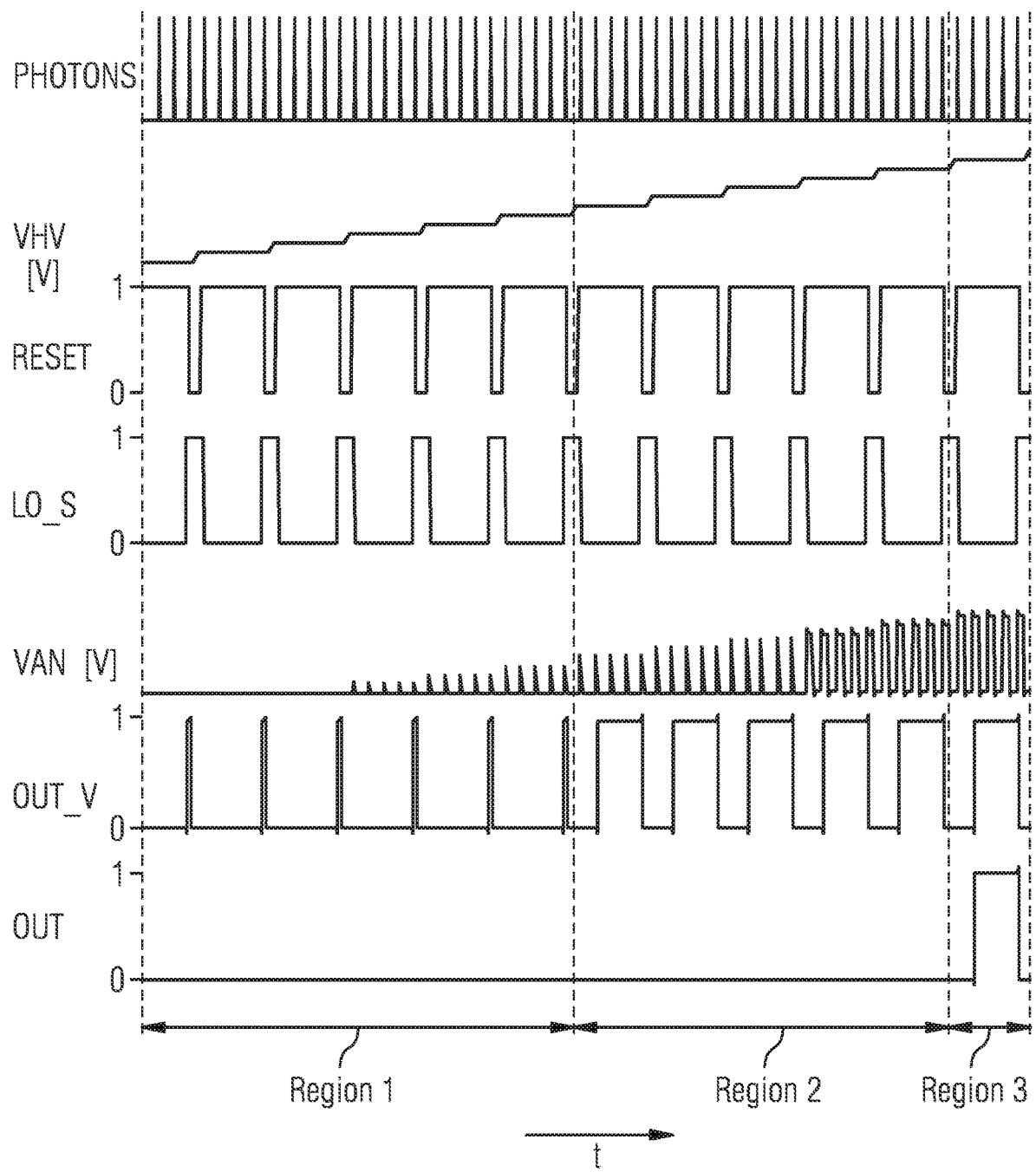

AVALANCHE DIODE ARRANGEMENT AND METHOD FOR CONTROLLING AN AVALANCHE DIODE ARRANGEMENT

CROSS-REFERENCE TO RELATED APPLICATIONS

The present application is the national stage entry of International Patent Application No. PCT/EP2018/066263, filed on Jun. 19, 2018, which claims the benefit of priority of European Patent Application No. 17177640.4, filed on Jun. 23, 2017, all of which are hereby incorporated by reference in their entirety for all purposes.

BACKGROUND OF THE INVENTION

The present patent application is related to an avalanche diode arrangement and a method for controlling an avalanche diode arrangement.

An avalanche diode is a highly sensitive optical device. Often the avalanche diode is used as a single photon avalanche diode, abbreviated as SPAD. The SPAD can be used to detect a point of time, when a photon hits the optical device. The SPAD is able to work in a so-called Geiger mode. In the Geiger mode, the SPAD is reverse biased with a bias voltage higher than a breakdown voltage of the avalanche diode. When the photon hits the SPAD, an electron-hole pair is generated and a very high short current pulse is generated due to the very high electrical field. The performance of the SPAD depends on how much higher the bias voltage is than the breakdown voltage. The bias voltage of the SPAD can be expressed as $VHV=VBD+VEX$, wherein VHV is a value of the bias voltage of the avalanche diode, VBD is a value of the breakdown voltage of the avalanche diode and VEX is a value of an excess bias voltage.

SUMMARY OF THE INVENTION

In an embodiment, an avalanche diode arrangement comprises an avalanche diode, a latch comparator and a quenching circuit. The avalanche diode is coupled to a first voltage terminal and to a first node. The latch comparator comprises a first input coupled to the first node, a second input for receiving a reference voltage and an enable input for receiving a comparator enable signal. The quenching circuit is coupled to the first node.

Advantageously, an excess bias voltage can be tapped at the first node, when a photon hits the avalanche diode. This excess bias voltage can be compared with the reference voltage by the latch comparator. Without a photon hitting the avalanche diode, a node voltage that is tapped at the first node is very low and, thus, is lower than the reference voltage.

Advantageously, the latch comparator can be set active by the comparator enable signal. Thus, the latch comparator only operates during a period of time in which a comparison of the voltages at the first and the second input of the latch comparator is required, namely shortly after a photon causes a current flow in the avalanche diode. Consequently, a power consumption of the avalanche diode arrangement can be kept low be setting the latch comparator in an idle state by the comparator enable signal during most of the time.

In an embodiment, the avalanche diode is connected to the first voltage terminal and to the first node. The first input of the latch comparator is connected to the first node. The quenching circuit is connected to the first node. The avalanche diode has an anode connected to the first node and a cathode connected to the first voltage terminal.

The avalanche diode may be realized as a single photon avalanche diode, abbreviated as SPAD.

In an embodiment, the avalanche diode arrangement comprises a digital control circuit having a node input coupled to the first node and an enable output coupled to the enable input of the latch comparator. The node input of the digital control circuit may be connected to the first node. The enable output of the digital control circuit may be connected to the enable input of the latch comparator.

In an embodiment, the digital control circuit generates the comparator enable signal as a function of a node voltage that is tapped at the first node.

Advantageously, the latch comparator can be set as active and inactive by the digital control circuit. Thus, a power consumption of the avalanche diode arrangement can be kept low by setting the latch comparator in an idle state during most of the time. In case there is a lot of light, the node voltage at the first node has a high value that is above the reference voltage provided to the latch comparator. By the connection of the digital control circuit to the enable input of the latch comparator it is achieved that the latch comparator does not perform a comparison in case of a lot of light.

In further development, the digital control circuit comprises an inverter with an input coupled to the node input and an output coupled to the enable output. The input of the inverter may be connected to the node input. The inverter may detect a photon event. When the photon hits the avalanche diode, the node voltage at the first node rises and as soon as the node voltage becomes higher than a threshold voltage of the inverter, a signal at the output of the inverter changes its logical value.

In an embodiment, the digital control circuit comprises a flip-flop with an input coupled to an output of the inverter and an output coupled to the enable output. The output of the flip-flop may be connected to the enable output.

In an embodiment, the avalanche diode arrangement comprises a voltage divider coupling the first node to a second voltage terminal, wherein a divider tap of the voltage divider is coupled to the first input of the latch comparator. The divider tap of the voltage divider may be connected to the first input of the latch comparator. Advantageously, a voltage derived from the node voltage is applied to the first input of the latch comparator. Advantageously, a voltage provided to the latch comparator in the case of a trigger event is reduced by the voltage divider.

In an embodiment, the avalanche diode arrangement comprises a bandgap circuit coupled to the second input of the latch comparator. Thus, the bandgap circuit generates the reference voltage. The bandgap circuit may be connected also to other circuit parts which are integrated together with the avalanche diode arrangement on a semiconductor body.

In an embodiment, the latch comparator generates a comparator output signal as a function of a comparison of the voltages at the first and the second input of the latch comparator in case of a first logical value of the comparator enable signal and generates the comparator output signal with a constant value in case of a second logical value of the comparator enable signal. The constant value may be the same value that is generated by the latch comparator, when the latch generator is enabled and the voltage at the first input is lower than the reference voltage. Typically, the constant value may be the logical value 0, represented by 0 Volt.

The comparator enable signal may have a pulse form. During the pulse, the comparator enable signal has the first logical value. Outside of the pulse, the comparator enable signal has the second logical value.

In an embodiment, the latch comparator comprises a first input transistor with a control terminal coupled or connected to the first input of the latch comparator and a second input transistor with a control terminal coupled or connected to the second input of the latch comparator. The latch comparator comprises a current source transistor with a control terminal coupled or connected to the enable input of the latch comparator and a first terminal coupled or connected to a first terminal of the first input transistor and to a first terminal of the second input transistor. When the comparator enable signal having the second logical value sets the current source transistor in a non-conducting state, no current may flow through the latch comparator, thus reducing the power consumption of the avalanche diode arrangement.

In an embodiment, the latch comparator comprises a first control transistor having a control terminal coupled or connected to the enable input of the latch comparator and a first terminal coupled or connected to a comparator output of the latch comparator. The comparator output signal is provided at the comparator output by the latch comparator. A second terminal of the first control transistor may be connected to a supply voltage terminal. A supply voltage can be tapped at the supply voltage terminal. The first control transistor may provide the supply voltage to the comparator output when the comparator enable signal having the second logical value sets the first control transistor in a conducting state.

The avalanche diode arrangement may comprise a bias voltage generator coupled to the first voltage terminal. The bias voltage generator may be connected to the first voltage terminal. The bias voltage generator may generate a bias voltage that is applied to the first voltage terminal. The bias voltage generator can be realized in different ways, like a charge pump, a DC-DC converter, an AC-DC converter etc.

The avalanche diode arrangement may comprise a control circuit having a first input coupled or connected to the comparator output and a control output coupled or connected to a control input of the bias voltage generator.

In an embodiment, the bias voltage generator and the control circuit are configured to increase the bias voltage in case a comparator output signal of the latch comparator indicates that a voltage at the first input of the latch comparator is less than the reference voltage.

In an embodiment, the avalanche diode arrangement comprises a digital cell circuit having a first input coupled to the comparator output and a first output for providing a first output signal coupled to the first input of the control circuit. The digital cell circuit generates the first output signal as a function of the comparator output signal. The bias voltage generator and the control circuit are configured to increase the bias voltage in case the first output signal of the digital cell circuit indicates that a voltage at the first input of the latch comparator is less than the reference voltage.

The quenching circuit may comprise a quenching resistor coupled or connected to the first node and to a second voltage terminal. The quenching circuit may optionally comprise a quenching switch coupling the quenching resistor to the first node or the quenching resistor to the second voltage terminal.

The quenching circuit may comprise a series circuit of a reset resistor and a reset switch. The series circuit is coupled or connected to the first node and to the second voltage terminal.

The avalanche diode arrangement is realized as an excess bias voltage monitoring circuit.

In an embodiment, the avalanche diode arrangement relies on successive steps for adjusting the bias voltage. The avalanche diode arrangement does not monitor a breakdown voltage but directly monitors the excess bias voltage of the SPAD. In every measurement cycle, there is only one measurement. The avalanche diode arrangement does not have static power consumption. The avalanche diode arrangement may be extremely efficient in power consumption. Advantageously, a low power design can be realized. The avalanche diode arrangement compares the excess bias voltage of the SPAD directly with the desired reference voltage. The accuracy of the measurement of the excess bias voltage depends only on the performance of the latch comparator and crosstalk. The avalanche diode arrangement may be free for an additional circuit to detect when the SPAD has triggered. The voltage on the anode of the SPAD is not only the voltage on which the excess bias voltage is stored. It is also a signal event for the latch comparator to compare this voltage with the reference voltage. Advantageously, the circuit is mostly digital.

In an embodiment, the avalanche diode arrangement may be free of an additional element for storing the measurement results. The latch comparator works like a latch. It stores the value of the measurement until the circuit is reset.

In an embodiment, a method for controlling an avalanche diode arrangement comprises
  generating a node voltage at a first node that is coupled via an avalanche diode to a first voltage terminal and via a quenching circuit to a second voltage terminal,
  providing the node voltage or a voltage derived from the node voltage to a first input of a latch comparator,
  providing a reference voltage to a second input of the latch comparator,
  providing a comparator enable signal to an enable input of the latch comparator, and
  generating a comparator output signal as a function of the voltages at the first and the second input of the latch comparator and the comparator enable signal.

The voltages at the first and the second input of the latch comparator may be the node voltage or the voltage derived from the node voltage and the reference voltage.

In an embodiment, the latch comparator generates the comparator output signal as a function of a comparison of the voltages at the first and the second input of the latch comparator in case of a first logical value of the comparator enable signal and generates the comparator output signal with a constant value in case of a second logical value of the comparator enable signal.

In an embodiment, the node voltage is provided to a node input of a digital control circuit. The digital control circuit generates the comparator enable signal as a function of the node voltage.

In an embodiment, the avalanche diode arrangement performs a calibration phase comprising a series of measurement cycles. A bias voltage is provided to the first voltage terminal and has a predetermined value during a first measurement cycle of the series of measurement cycles. The bias voltage is increased by a predetermined step after each measurement cycle of the series of measurement cycles, if the comparator enable signal has the first logical value during the measurement cycle and the latch comparator does not generate a pulse of the comparator output signal during the measurement cycle.

In an embodiment, the bias voltage is kept constant, if the latch comparator generates a pulse of the comparator output signal during the measurement cycle. The constant value of the bias voltage may be used in a measurement phase following the calibration phase.

Advantageously, a pulse of the comparator output signal indicates that the bias voltage is high enough such that an excess voltage is higher than a predetermined value of the excess voltage.

BRIEF DESCRIPTION OF THE DRAWINGS

The following description of figures of exemplary embodiments may further illustrate and explain aspects of the patent application. Devices and circuit parts with the same structure and the same effect, respectively, appear with equivalent reference symbols. In so far as devices or circuit parts correspond to one another in terms of their function in different figures, the description thereof is not repeated for each of the following figures.

FIGS. 2A to 2D show exemplary embodiments of a quenching circuit;

FIG. 3 shows an exemplary embodiment of a latch comparator;

FIGS. 5A to 5C show exemplary signals being tapped in an avalanche diode arrangement.

DETAILED DESCRIPTION

Figure 1A:
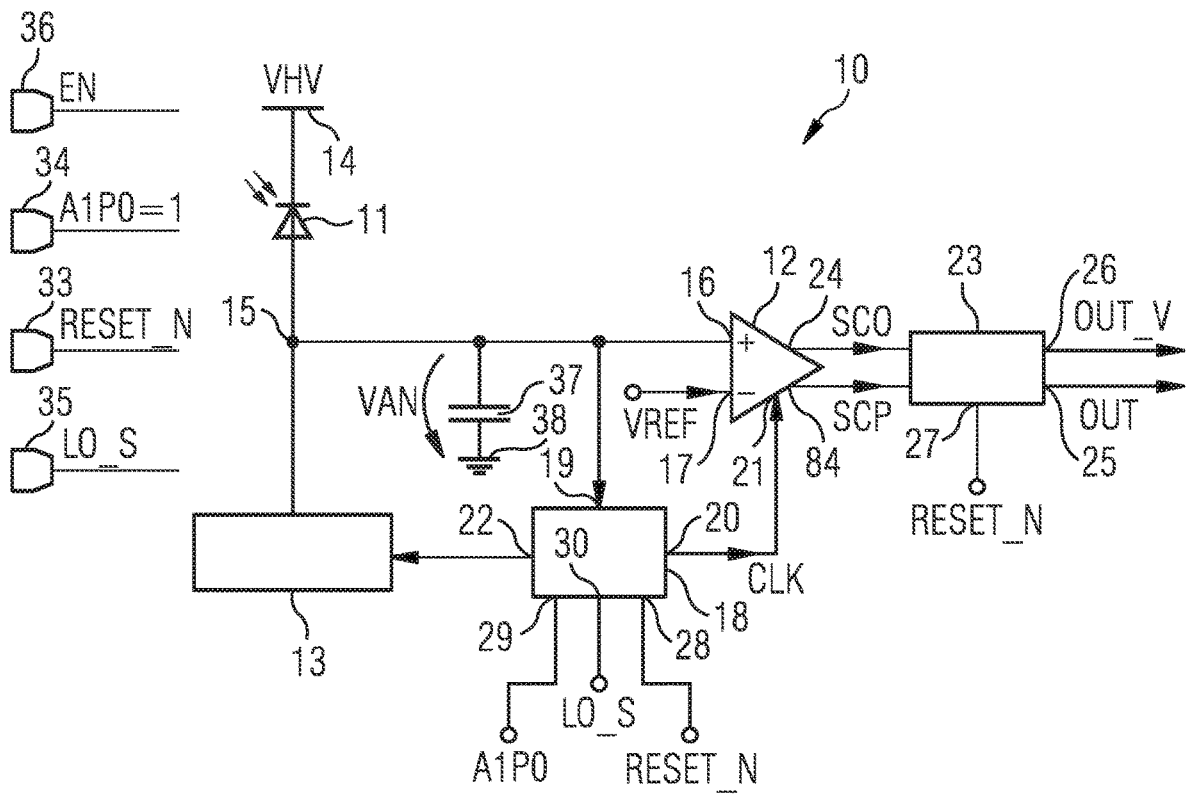
FIGS. 1A to 1D show exemplary embodiments of an avalanche diode arrangement.

FIG. 1A shows an exemplary embodiment of an avalanche diode arrangement 10 comprising an avalanche diode 11, a latch comparator 12 and a quenching circuit 13. The avalanche diode 11 is realized as a single photon avalanche diode, abbreviated SPAD. The avalanche diode 11 is coupled to a first voltage terminal 14 of the avalanche diode arrangement 10 and to a first node 15 of the avalanche diode arrangement 10. An anode of the avalanche diode 11 may be connected to the first node 15, whereas a cathode of the avalanche diode 11 may be connected to the first voltage terminal 14. The quenching circuit 13 is coupled to the first node 15. The latch comparator 12 comprises a first input 16 coupled to the first node 15. Moreover, the latch comparator 12 comprise a second input 17. The first input 16 may be realized as a non-inverting input and the second input 17 of the latch comparator 12 may be realized as an inverting input.

The avalanche diode arrangement 10 comprises a digital control circuit 18 having a node input 19 coupled to the first node 15. An enable output 20 of the digital control circuit 18 is connected to an enable input 21 of the latch comparator 12. A control output 22 of the digital control circuit 18 is coupled to an input of the quenching circuit 13. Optionally, a node capacitor 37 couples the first node 15 to a second voltage terminal 38. The second voltage terminal 38 may be a reference potential terminal or ground terminal.

The anode of the avalanche diode 11 may be directly and permanently connected to the first node 15. The cathode of the avalanche diode 11 may be directly and permanently connected to the first voltage terminal 14. The quenching circuit 13 may be directly and permanently connected to the first node 15. Correspondingly, the first input 16 of the latch comparator 12 may be directly and permanently connected to the first node 15. Additionally, the node input 19 of the digital control circuit 18 may be directly and permanently connected to the first node 15.

The avalanche diode arrangement 10 comprises a digital cell circuit 23 having a first input coupled to a comparator output 24 of the latch comparator 12. The first input of the digital cell circuit 23 may be directly and permanently connected to the comparator output 24. The digital cell circuit 23 may have a second input coupled to a further comparator output 84 of the latch comparator 12. The second input of the digital cell circuit 23 may be directly and permanently connected to the further comparator output 84 of the latch comparator 12. The digital cell circuit 23 comprises more than one digital cell. A digital cell may be a NOR-gate, a NAND-gate, an inverter, a flip-flop, a latch or a delay circuit. The digital cell circuit 23 has a first output 25. Moreover, the digital cell circuit 23 may have a second output 26 and a control input 27.

The digital control circuit 18 may comprise a first to a third control input 28 to 30. The avalanche diode arrangement 10 comprises several terminals 33 to 36. The terminals 33 to 36 may be implemented as pins or bonding pads. A first terminal 33 of the avalanche diode arrangement 10 is connected to the control input 27 of the digital cell circuit 23 and to the first control input 28 of the digital control circuit 18. A second terminal 34 of the avalanche diode arrangement 10 is connected to the second control input 29 of the digital control circuit 18. A third terminal 35 of the avalanche diode arrangement 10 is connected to the third control input 30 of the digital control circuit 18.

A bias voltage VHV is provided to the first voltage terminal 14. The bias voltage VHV is applied to the cathode of the avalanche diode 11. A ground potential or reference potential is tapped at the second voltage terminal 38. The bias voltage VHV is a positive voltage with respect to the reference potential. At the first node 15, a node voltage VAN is provided. A node voltage VAN is tapped at the anode of the avalanche diode 11. The difference between the bias voltage VHV and the node voltage VAN is applied between the cathode and the anode of the avalanche diode 11. The node voltage VAN is provided to the quenching circuit 13 and to the node input 19 of the digital control circuit 18. The node voltage VAN is applied to the first input 16 of the latch comparator 12. A reference voltage VREF is provided to the second input 17 of the latch comparator 12. The latch comparator 12 generates a comparator output signal SCO as a function of a comparison of the voltage tapped at the first input 16 and the voltage tapped at the second input 17 of the latch comparator 12. Thus, the comparator output signal SCO is a function of a comparison of the node voltage VAN and of the reference voltage VREF. The comparator output signal SCO is provided at the comparator output 24. The latch comparator 12 generates a further comparator output signal SCP as a function of a comparison of the voltage tapped at the first input 16 and the voltage tapped at the second input 17 of the latch comparator 12. Thus, the further comparator output signal SCP is a function of a comparison of the node voltage VAN and of the reference voltage VREF. The further comparator output signal SCP is provided at the further comparator output 84.

In case a photon hits the avalanche diode 11, the node voltage VAN is equal to the excess bias voltage VEX. The excess bias voltage VEX can also be named excess voltage. The latch comparator 12 compares the excess bias voltage VEX of the avalanche diode 11 with the reference voltage VREF which may be the desired or predetermined value of the excess bias voltage VEX.

The digital control circuit 18 generates a comparator enable signal CLK. The comparator enable signal CLK is provided from the digital control circuit 18 via the enable output 20 to the enable input 21 of the latch comparator 12. Thus, the comparator output signal SCO is also a function of the comparator enable signal CLK. In the case of a first logical value of the comparator enable signal CLK, the comparator output signal SCO is a function of the comparison of the voltages at the first and the second input 16, 17 of the latch comparator 12. In the case of a second logical value of the comparator enable signal CLK, the comparator output signal SCO is constant. The first logical value of the comparator enable signal CLK may be 1 and the second logical value of the comparator enable signal CLK may be 0. The further comparator output signal SCP is also a function of the comparator enable signal CLK. When the latch comparator 12 triggers, one of the comparator output signal SCO and the further comparator output signal SCP has the first logical value and the other has the second logical value.

The comparator output signal SCO is provided to the first input of the digital cell circuit 23. The digital cell circuit 23 generates a first output signal OUT at the first output 25. The first output signal OUT is a function of the comparator output signal SCO. A second output signal OUT_V is generated at the second output 26 of the digital cell circuit 23. The second output signal OUT_V indicates a valid hit of a photon, for example a hit of a photon on the avalanche diode 11 during a measurement cycle. The second output signal OUT_V may be independent from the comparator output signal SCO.

The further comparator output signal SCP is provided to the second input of the digital cell circuit 23. The digital cell circuit 23 determines the values of the first and the second output signal OUT, OUT_V as a function of the comparator output signal SCO and the further comparator output signal SCP.

At the first terminal 33 of the avalanche diode arrangement 10, a reset signal RESET_N can be tapped. The reset signal RESET_N is provided to the first control input 28 of the digital control circuit 18 and to the control input 27 of the digital cell circuit 23. At the second terminal 33 of the avalanche diode arrangement 10, a control signal A1PO can be tapped that is provided to the second control input 29 of the digital control circuit 18. A further control signal LO_S is provided at the third terminal 35 of the avalanche diode arrangement 10 and thus is applied to the third control input 30 of the digital control circuit 18. The further control signal LO_S may be a LOCK_STATE signal. An enable signal EN is provided to the fourth terminal 36 of the avalanche diode arrangement 10.

The latch comparator 12 can be implemented as a clocked comparator or a dynamic comparator. The latch comparator 12 does not operate continuously. The latch comparator 12 only operates during a pulse of the comparator enable signal CLK. The comparator enable signal CLK could also be named trigger signal or clock signal. However, a pulse of the comparator enable signal CLK is only generated after a rise of the node voltage VAN. The comparator enable signal CLK is not generated by an oscillator.

Alternatively, the bias voltage VHV is a negative voltage with respect to the reference potential.

Figure 1B:
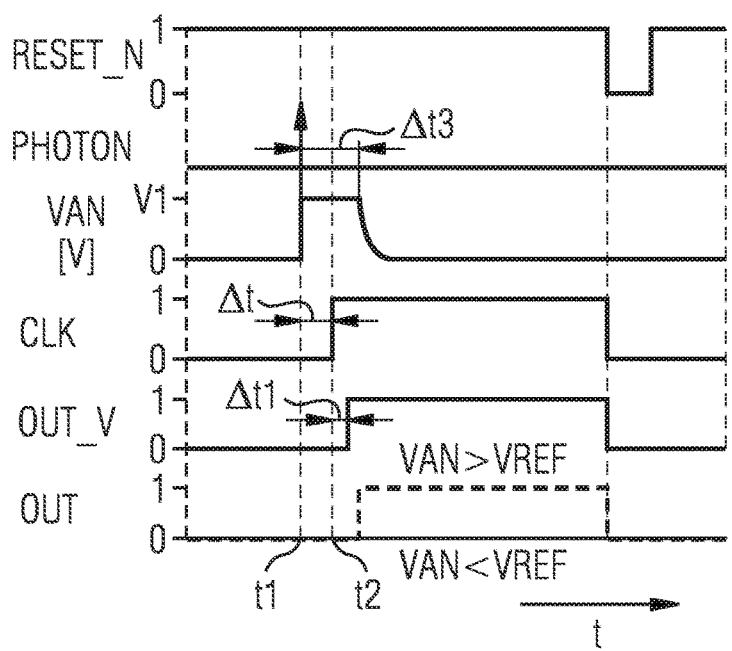

FIG. 1B shows exemplary signals of the avalanche diode arrangement 10 illustrated by FIG. 1A. The signals are shown as a function of a time t. At the start of operation, the reset signal RESET_N has the logical value 1. At a first point of time t1, a photon hits the avalanche diode 11. The node voltage VAN has the value 0 V before the first point of time t1 and quickly rises due to the photon hitting the avalanche diode 11. The node voltage VAN rises to a first value V1. Since the node voltage VAN is provided to the node input 19 of the digital control circuit 18, the digital control circuit 18 generates the comparator enable signal CLK.

A pulse of the comparator enable signal CLK starts at a second point of time t2 that follows the first point of time t1. Due to the circuit parts inside the digital control circuit 18, there is a digital delay time Δt between the rise of the node voltage VAN and the pulse of the comparator enable signal CLK. Thus, the second point of time t2 is equal to the first point of time t1 and the digital delay time Δt. After the second point of time t2 the latch comparator 12 generates the comparator output signal SCO (not shown) and provides it to the digital cell circuit 23. The digital cell circuit 23 generates the first output signal OUT with a first logical value, for example with the value 1 in case the node voltage VAN is higher than the reference voltage VREF. Similarly, the digital cell circuit 23 generates the first output signal OUT with a second logical value, for example the value of 0 in case that the node voltage VAN is less than the reference voltage VREF. Additionally the digital cell circuit 23 generates the second output voltage OUT_V.

The SPAD 11 detects the moment when a photon hits the optical sensor. The SPAD 11 works in the Geiger mode. Thus, the SPAD 11 is reverse biased with the bias voltage VHV higher than a breakdown voltage VBD. When the photon hits the SPAD 11, an electron-hole pair is generated and a very short high peak current pulse is generated due to the very high electrical field. The performance of the SPAD 11 depends on how much higher the bias voltage VHV is than a breakdown voltage VBD. The bias voltage VHV of the SPAD 11 can be expressed as VHV=VBD+VEX, wherein VHV is the reverse bias voltage of the SPAD 11, VBD is the breakdown voltage of the SPAD 11, and VEX is the excess bias voltage. SPAD parameters like dark count rate, abbreviated DCR, photon detection probability, abbreviated PDP, after pulsing, abbreviated AP, and timing jitter depend on the excess bias voltage VEX. Because the breakdown voltage VBD is a function of temperature, for a fixed bias voltage VHV, the excess bias voltage VEX changes if the temperature is changing. In time correlated single photon counting applications (TCSPC) and time-of-flight applications (TOF) it is very important to have the SPAD parameters constant for different temperature conditions. If this is not the case for constant VHV and different temperature conditions, the PDP, DCR, AP are going to change and systematic timing jitter in the measurement is introduced.

Advantageously, the avalanche diode arrangement 10 monitors the excess bias voltage VEX of the SPAD 11 and compares it with the reference voltage VREF. The bias voltage VHV starts with the lowest possible value that is defined with the minimum breakdown voltage of the SPAD 11 in a specific technology. This starting voltage can be estimated from SPAD characterization measurements. In every measurement cycle, the bias voltage VHV is increased for a predetermined voltage step. When the first output signal OUT becomes the logical value 1, the target value of the bias voltage VHV is reached.

Figure 2A:
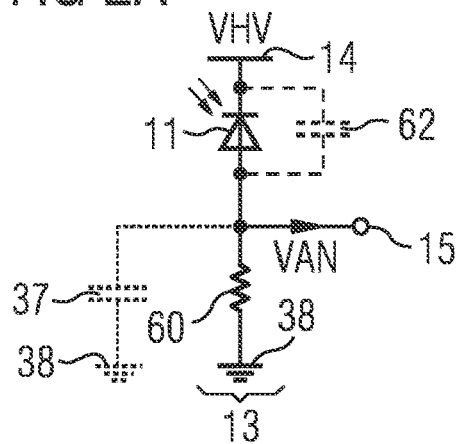

The avalanche diode arrangement 10 realizes a circuit implementation with excess bias reference voltage and active reset mode. When the enable signal EN=0, the avalanche diode arrangement 10 is off. When the enable signal EN=1, the avalanche diode arrangement 10 in on. The SPAD 11 uses a passive quencher 13. The SPAD 11 can be reset in active or passive reset mode. Two modes are controlled by the control signal A1P0. The control signal A1P0 with the logic value 1 activates the active reset mode. The control signal A1P0 with the logic value 0 activates the passive reset mode. The passive reset mode is illustrated in FIG. 2A. The active reset mode may be shown in FIGS. 2B and 2C.

The signal RESET_N at the input pin 33 resets the latch comparator 12 before every measurement cycle. When the signal RESET_N=0, the output signals OUT_V and OUT are set to 0, and the parasitic nodes of the latch comparator 12 are charged to a supply voltage VDD.

The further control signal LO_S blocks any light event that can trigger the latch comparator 12 during enable or reset phase. During the period when the further control signal LO_S=0 (see FIG. 5C), the latch comparator 12 is already prepared for the measurement and it waits for a light event to trigger the SPAD 11. If the SPAD 11 triggers, the charges from the SPAD 11 start to flow through the quenching circuit 13. Because the bias voltage VHV=constant, and the voltage on the SPAD 11 (between cathode and anode) rolls off due to discharging of junction capacitance, the voltage on the SPAD anode will increase from 0 up to VEX. When the voltage on the SPAD 11 becomes equal to the breakdown voltage VBD, the SPAD 11 is quenched (current I=0). At that point in time, the voltage on the anode becomes the excess voltage VEX, because VHV=VBD+VEX.

When the avalanche diode arrangement 10 is in the active reset mode (the control signal A1P0=1) and the further control signal LO_S=0, after the light event the SPAD 11 will trigger and the anode voltage VAN will jump from 0 to the excess voltage VEX in a very short period of time. This will also be a signal for the digital control circuit 18 to cut off the current path from anode to the ground 38. This will provide that the voltage on the anode parasitic capacitance will stay at the excess voltage VEX until the digital control circuit 18 activates an active reset switch 63 shown in FIG. 2B or the switches 63, 65 shown in FIG. 2C and discharges this node to the ground 38. During the time when the SPAD 11 is quenched (dead time Δt3) the voltage VAN on the anode is the excess voltage VEX. The dead time Δt3 should be long enough so that the latch comparator 12 has enough time to make the comparison.

When the avalanche diode arrangement 10 is in the passive reset mode (the control signal A1P0=0) and the further control signal LO_S=0, and the SPAD 11 has triggered, the voltage VAN on the anode will again jump from 0 V to the excess voltage VEX in a short period of time and then it will start to roll of immediately. To provide almost flat voltage change on the anode of the SPAD 11, the current through the passive quenching circuit 13 should be low.

The RC constant of the SPAD 11 is usually very small and the digital delay time Δt through the digital control circuit 18 is always longer than the time needed for the voltage VAN on the anode to rise from 0 V to the excess voltage VEX. This makes the latch comparator 12 usable in this configuration. So, the voltage VAN on the anode will reach the excess bias voltage VEX before the comparator enable signal CLK from the digital control circuit 18 triggers the latch comparator 12 to do the comparison.

In every measurement cycle as soon as the latch comparator 12 makes the comparison, it stays locked until the reset signal RESET_N=0 or the enable signal EN=0. That means that any other event cannot change the state of the latch comparator 12, or in other words, the latch comparator 12 does not consume power till the end of measurement cycle. At the beginning of every measurement cycle, the first output signal OUT and the second output signal OUT_V are set to 0. After the latch comparator 12 has latched, the second output signal OUT_V will be set to 1. This is an information that the measurement has finished. When the second output signal OUT_V becomes 1, the first output signal OUT is already stabilized to the logic value 1 if the node voltage VAN is larger than the reference voltage (VAN>VREF) or it stays at the logic value 0 if the node voltage VAN is less than the reference voltage VREF (VAN<VREF). In this embodiment, the reference voltage VREF is equal to the predetermined value of the excess voltage VEX, thus VREF=VEX. Usually the predetermined value of the excess voltage VEX is higher than 2 V, so to generate a fixed reference voltage VREF, the avalanche diode arrangement 10 may additionally comprise a voltage regulator circuit.

Figure 1C:
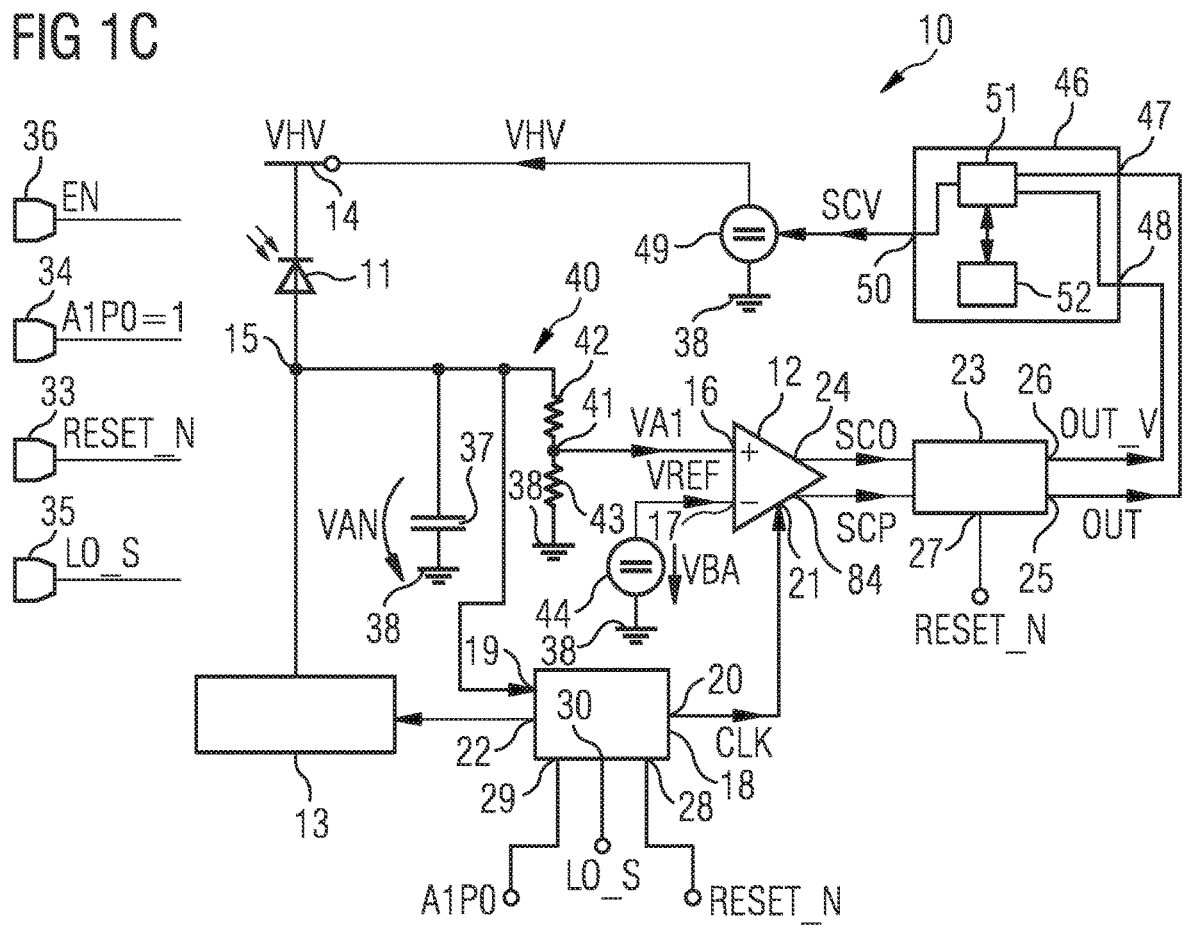

FIG. 1C shows a further exemplary embodiment of the avalanche diode arrangement 10 that is a further development of the embodiment described in FIGS. 1A and 1B. The avalanche diode arrangement 10 comprises a voltage divider 40 coupling the first node 15 to the second voltage terminal 38. A divider tap 41 of the voltage divider 40 is connected to the first input 16 of the latch comparator 12. The voltage divider 40 comprises a first and a second divider element 42, 43. The first divider element 42 couples the first node 15 to the divider tap 41, whereas the second divider element 43 couples the divider tap 41 to the second voltage terminal 38. The first and the second divider element 42, 43 may be realized as resistors. The voltage divider 40 is implemented as a resistive voltage divider. The avalanche diode arrangement 10 may comprise a band gap circuit 44 that is coupled to the second input 17 of the latch comparator 12. The output of the band gap circuit 44 may be directly connected to the second input 17 of the latch comparator 12.

Additionally, the avalanche diode arrangement 10 comprises a control circuit 46 having a first input 47 coupled to the first output 25 of the digital cell circuit 23. A second input 48 of the control circuit 46 is coupled to the second output 26 of the digital cell circuit 23. The avalanche diode arrangement 10 comprises a bias voltage generator 49 coupled to the first voltage terminal 14. Thus, the bias voltage generator 49 is connected on one side to the first voltage terminal 14 and on the other side to the second voltage terminal 38. A control output 50 of the control circuit 46 is connected to a control input of the bias voltage generator 49. The control circuit 46 may comprise a microprocessor 51 and a memory 52. The control circuit 46 may be realized as a microcontroller.

The first output signal OUT of the digital cell circuit 23 is provided to the first input 47 of the control circuit 46. The comparator output signal SCO and thus the first output signal OUT only have a pulse in case the voltage at the first input 16 of the latch comparator 12 is higher than the voltage at the second input 17 of the latch comparator 12 and the comparator enable signal CLK is generated with a first logical value. When the comparator output signal SCO and thus the first output signal OUT do not obtain a pulse, the value of the excess voltage VEX is too small. Thus, the control circuit 46 generates a control signal SCV and provides the control signal SCV to the control input of the bias voltage generator 49 such that the bias voltage VHV is increased by a predetermined voltage step.

A divider tap voltage VA1 is tapped at the divider tap 41. The divider tap voltage VA1 is a voltage derived from the node voltage VAN. The divider tap voltage VA1 is a function of the node voltage VAN and of the resistance values of the first and the second divider element 42, 43. In case that the first and the second divider element 42, 43 have the same resistance value, a value of the divider tap voltage VA1 is half of a value of the node voltage VAN. The latch comparator 12 compares the divider tap voltage VA1 with the reference voltage VREF. The reference voltage VREF is provided by the band gap circuit 44 or another reference voltage available in the system or chip.

In an alternative, not shown embodiment, the first and the second divider element 42, 43 are realized as transistors. Thus, the voltage divider 40 can be realized as a transistor voltage divider. The voltage divider 40 can also be realized in other ways.

Figure 1D:
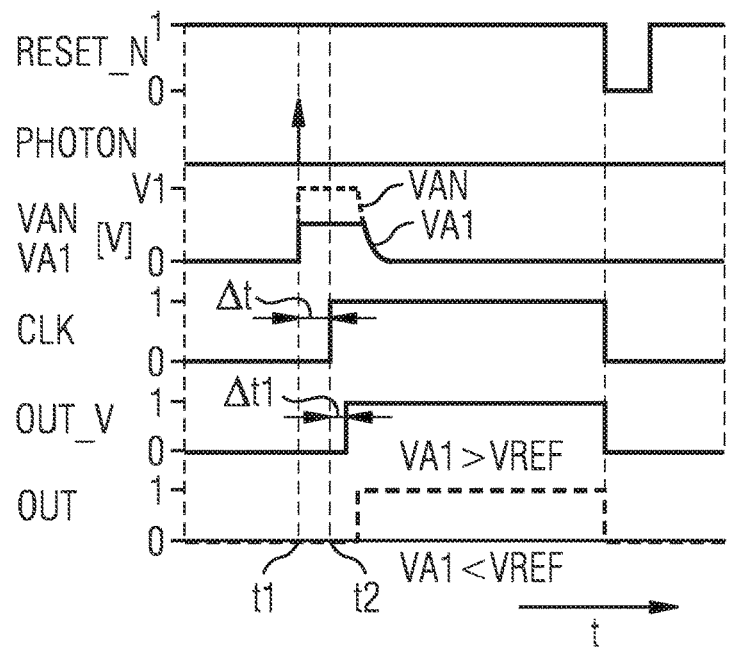

FIG. 1D shows a further exemplary embodiment of signals that can be tapped in the avalanche diode arrangement 10 shown in FIG. 1C. The difference of FIG. 1D in comparison to FIG. 1B is that in FIG. 1D the divider tap voltage VA1 is shown. The comparator output signal SCO and thus the first output signal OUT is a function of a comparison of the divider tap voltage VA1 and the reference voltage VREF.

The avalanche diode arrangement 10 implements a circuit with bandgap reference voltage and active reset mode. The avalanche diode arrangement 10 can also work, when the reference voltage VREF is equal to the bandgap voltage VBA, thus VREF=VBA. For this kind of avalanche diode arrangement 10, the voltage divider 40 and additional logic or software support may be designed. If a value of the excess voltage VEX=3 V has to be achieved for example, one can start sweeping the bias voltage VHV and when one detects the first output signal OUT=1, this can be the information that the present excess bias voltage VEX of the SPAD 11 is a little bit higher than 2.4 V (VAN~2.4 V and VA1~1.2 V). Afterwards, supporting software or digital hardware solution can be activated to rise the bias voltage VHV for additional 0.6 V, to get 3 V target value for the excess voltage VEX. In principal, the same circuit from FIG. 1A can be used, but when the reference voltage VREF=1.2 V, the SPAD 11 is much less sensitive. Also, if the predetermined value of the excess voltage VEX is 2.4 V or less, one can use this kind of topology without additional logic or software support.

FIG. 2A shows an exemplary embodiment of the quenching circuit 13 that can be used in the avalanche diode arrangement 10 shown in FIGS. 1A and 1C. The quenching circuit 13 comprises a quenching resistor 60 coupling the first node 15 to the second voltage terminal 38. A first terminal of the quenching resistor 60 is coupled to the first node 15 and a second terminal of the quenching resistor 60 is coupled to the second voltage terminal 38. The first terminal of the quenching resistor 60 may be directly and permanently connected to the first node 15. The second terminal of the quenching resistor 60 may be directly and permanently connected to the second voltage terminal 38. The node capacitor 37 may couple the first node 15 to the second voltage terminal 38. Additionally, the avalanche diode arrangement 10 may comprise a diode capacitance 62 that couples the anode of the avalanche diode 11 to the cathode of the avalanche diode 11. The diode capacitance 62 may be a parasitic capacitance of the avalanche diode 11.

The quenching circuit 13 is implemented as a passive quenching circuit. In FIG. 2A, the simplest passive quenching circuit is shown. Before a photon event, the current I through the avalanche diode 11 is zero and so the node voltage VAN. After the photon event, the voltage on the SPAD 11 starts to roll off because the diode capacitance 62 starts to discharge through the depletion region (avalanche effect), and the node voltage VAN increases. When the voltage on the avalanche diode 11 reaches the breakdown voltage VBD, the avalanche diode 11 is quenched (current through the depletion region is zero) and the node voltage VAN is equal to the excess voltage VEX. This is performed in a very short period of time (picosecond range). After this point, the node voltage VAN starts to roll off, and the voltage on the SPAD 11 increases (the diode capacitance 62 is charging).

Figure 2B:
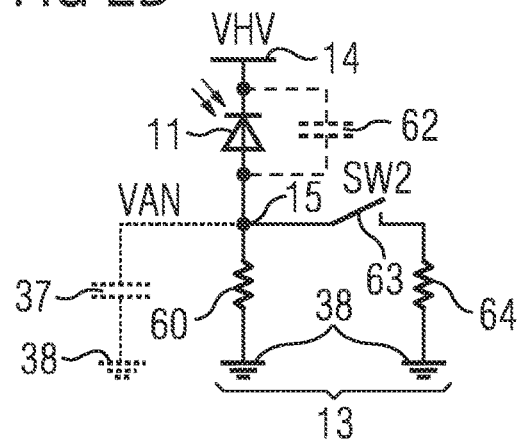

FIG. 2B shows a further exemplary embodiment of the quenching circuit 13. The quenching circuit 13 additionally comprises a reset switch 63 and a reset resistor 64. A series connection of the reset switch 63 and of the reset resistor 64 is arranged between the first node 15 and the second voltage terminal 38. The reset switch 63 may be connected to the first node 15 and the reset resistor 64 may be connected to the second voltage terminal 34. A resistance value RA of the reset resistor 64 may be smaller than a resistance value RP of the quenching resistor 60. For example RA<<RP or RA·10<RP. The operation after the photon event is the same like in FIG. 2A, up to the third point of time t3, when the reset switch 63 is set in a conducting state and the SPAD 11 is recharged to the bias voltage VHV in a short period of time (active reset mode).

In an alternative, not shown embodiment, the reset switch 63 is connected to the second voltage terminal 38 and the reset resistor 64 is connected to the first node 15.

Figure 2C:
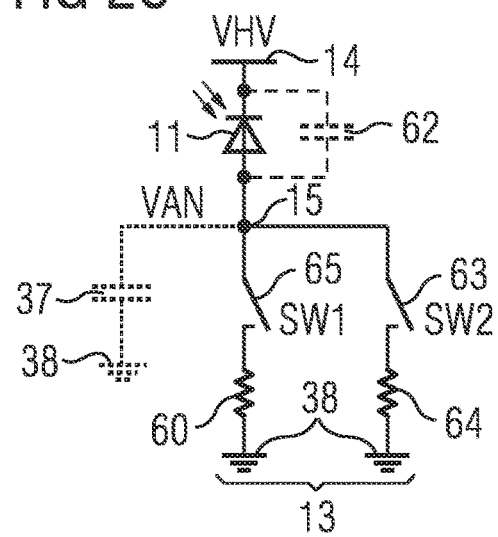

FIG. 2C shows a further exemplary embodiment of the quenching circuit 13. The quenching circuit 13 comprises a quenching switch 65. The quenching resistor 60 and the quenching switch 65 are arranged in series. Thus, the series connection of the quenching switch 65 and of the quenching resistor 60 is arranged between the first node 15 and the second voltage terminal 38. The quenching switch 65 may be connected to the first node 15, whereas the quenching resistor 60 may be connected to the second voltage terminal 38. At the beginning the quenching switch 65 is in a conducting state and the reset switch 63 is in a non-conducting state. After an event at the first point of time t1, when the node voltage VAN is equal to the excess voltage VEX, the quenching switch 65 is in a non-conducting state. Between the first and the third point of time t1, t3, the excess voltage VEX is stored on the node capacitor 37. The node capacitor 37 may be a parasitic capacitance between the first node 15 and the second voltage terminal 38 that may be a ground node. Alternatively, the node capacitor 37 may be fabricated as a physical component or circuit element. After the dead time Δt3, the quenching switch 65 and the reset switch 63 are in a conducting state and the SPAD 11 is recharged to the bias voltage VHV.

In an alternative, not shown embodiment, the quenching switch 65 is connected to the second voltage terminal 38 and the quenching resistor 60 is connected to the first node 15.

In FIGS. 2A to 2C, the quenching circuit is realized as a passive quencher with active and passive reset methods. In FIGS. 2B and 2C, the quenching circuit 13 is realized as an active quenching circuit or as a passive quenching circuit with active charging mode.

FIG. 2D shows exemplary signals of the avalanche diode arrangement 10 as a function of the time t. In FIG. 2D, timing diagrams of active and passive quenching are explained. At the first point of time t1, a photon hits the avalanche diode 11 as shown in the first line of FIG. 2D. The second line of FIG. 2D shows the node voltage VAN for the quenching circuit 13 realized as shown in FIG. 2A, the third line for the quenching circuit 13 realized as shown in FIG. 2B and the fourth line for the quenching circuit 13 realized as shown in FIG. 2C.

Before the first point of time t1, the node voltage VAN has the value of 0 V. At the first point of time t1, when the photon hits the avalanche diode 11, the node voltage VAN quickly rises to the first value V1. The first value V1 is equal to the excess voltage VEX. The photon causes an avalanche of charge carriers in the avalanche diode 11 and thus a rise of the current I flowing through the reverse biased avalanche diode 11. The current I flows from the first voltage terminal 14 through the avalanche diode 11 and the quenching resistor 60 to the second voltage terminal 38 and causes a rise of a voltage drop at the quenching resistor 60 and thus a rise of the node voltage VAN. At a point of time, the voltage drop across the avalanche diode 11 becomes so small that a further avalanche of charge carriers is inhibited. At this point of time the current I through avalanche diode 11 becomes zero. Due to the node capacitor 37 and/or the diode capacitance 62, the node voltage VAN only slowly decreases. In the case of FIG. 2A, the decrease of the node voltage VAN only depends on the resistance value RP of the quenching resistor 60. After some time, the node voltage VAN approaches the value 0 V.

In the case of FIG. 2B, the digital control circuit 18 generates a switch control signal SW2 and provides it to the reset switch 63 such that the reset switch 63 is set in a conducting state at the third point of time t3. Since the digital control circuit 18 is coupled at the node input 19 to the first node 15, the digital control circuit 18 receives the information about the breakdown of the avalanche diode 11 and is able to generate the switch control signal SW2 for the reset switch 63. The dead time Δt3 is between the third point of time t3 and the first point of time t1. During the dead time Δt3 the discharge of the first node 15 is performed by the quenching resistor 60. After the third point of time t3, the discharge of the first node 15 is performed by the parallel circuit of the quenching resistor 60 and of the reset resistor 64. Thus, the node voltage VAN quickly drops to the value 0 V after the third point of time t3.

In the case of FIG. 2C, the last two lines of FIG. 2D show a switch control signal SW1 of the quenching switch 65 and the switch control signal SW2 of the reset switch 63 as used in the quenching circuit of FIG. 2C. The quenching switch 65 is set in a conducting state and the reset switch 63 is set in a non-conducting state before the photon hits the avalanche diode 11. After the first point of time t1, the quenching switch 65 and the reset switch 63 are both set in a non-conducting state. Thus, the node voltage VAN is constant during the dead time Δt3 and has the value of the excess voltage VEX. After the third point of time t3, both the quenching switch 65 and the reset switch 63 are set in a conducting state. Thus, the node voltage VAN quickly drops to 0 V. After some time, not indicated in FIG. 2D, the reset switch 63 is again set in a non-conducting state. The quenching switch 65 remains in a conducting state. Thus, the quenching circuit 13 is prepared for the next hit of a photon. The digital control circuit 18 generates the switch control signals SW1, SW2.

FIG. 3 shows an exemplary embodiment of the latch comparator 12 that can be used in the embodiments of the avalanche diode arrangement 10 shown in FIGS. 1A and 1C. The latch comparator 12 comprises a current source transistor 70, a first input transistor 71 and a second input transistor 72. The first input transistor 71 has a control terminal connected to the first input 16 of the latch comparator 12, whereas the second input transistor 72 has a control terminal connected to the second input 17 of the latch comparator 12. The current source transistor 70 has a control terminal connected to the enable input 21 of the latch comparator 12. The first terminal of the current source transistor 70 is directly connected to a first terminal of the first input transistor 71 and to a first terminal of the second input transistor 72. A second terminal of the current source transistor 70 is connected to the second voltage terminal 38.

The latch comparator 12 comprises a first and a second inverter 73, 74. The first inverter 73 couples a supply voltage terminal 75 to a second terminal of the first input transistor 71. The supply voltage terminal 75 may be not connected to the first voltage terminal 14. Correspondingly, the second inverter 74 couples the supply voltage terminal 75 to a second terminal of the second input transistor 72. The first inverter 73 comprises a first and a second inverter transistor 76, 77, whereas the second inverter 74 comprises a third and a fourth inverter transistor 78, 79. The first and the third inverter transistors 76, 78 are connected to the supply voltage terminal 75. The second inverter transistor 77 is connected to the second terminal of the first input transistor 71 and the fourth inverter transistor 79 is connected to the second terminal of the second input transistor 72. An output of the first inverter 73 is connected to an input of the second inverter 74 and an output of the second inverter 74 is connected to an input of the first inverter 73. The output of the first inverter 73 is coupled to the comparator output 24 of the latch comparator 12. The output of the second inverter 74 is coupled to the further comparator output 84 of the latch comparator 12.

A first comparator capacitor 80 of the latch comparator 12 couples the output of the first inverter 73 to the second voltage terminal 38. Correspondingly, a second comparator capacitor 81 of the latch comparator 12 couples the output of the second inverter 74 to the second voltage terminal 38. The first and the second comparator capacitor 80, 81 may be parasitic capacitances. The latch comparator 12 comprises a first control transistor 82 coupling the output of the first inverter 73 to the supply voltage terminal 75. A control terminal of the first control transistor 82 is connected to the enable input 21 of the latch comparator 12. Moreover, the latch comparator 12 comprises a second control transistor 83 coupling the output of the second inverter 74 to the supply voltage terminal 75. A control terminal of the second control transistor 83 is connected to the enable input 21 of the latch comparator 12.

The supply voltage VDD can be tapped at the supply voltage terminal 75. The supply voltage VDD is a constant voltage and may be different from the bias voltage VHV. The comparator enable signal CLK is provided to the control terminal of the current source transistor 70. Moreover, the comparator enable signal CLK is provided to the control terminals of the first and the second control transistors 82, 83.

The latch comparator 12 is realized as a symmetric comparator. The latch comparator 12 is implemented using metal-oxide-semiconductor field-effect transistors, abbreviated as MOSFETs. The latch comparator 12 may be free from a bipolar transistor.

The first and third inverter transistors 76, 78 and the first and the second control transistor 82, 83 are realized as p-channel MOSFETs. The second and the fourth inverter transistor 77, 79, the first and the second input transistor 71, 72 and the current source transistor 70 are realized as n-channel MOSFETs.

In the case that the comparator enable signal CLK has the second logical value (that means that the comparator enable signal CLK is low), the current source transistor 70 is set in a non-conducting state and the first and the second control transistors 82, 83 are set in a conducting state. The comparator capacitors 80, 81 on the input terminals 16, 17 are pre-charged to the supply voltage VDD. Thus, the comparator output signal SCO is constant. The comparator output signal SCO has a constant logical value. The further comparator output signal SCP has the logical value of the comparator output signal SCO. The comparator output signal SCO has nearly the value of the supply voltage VDD.

In the case that the comparator enable signal CLK has the first logical value (that means that the comparator enable signal CLK becomes high), the current source transistor 70 is set in a conducting state and the first and the second control transistors 82, 83 are set in a non-conducting state. In this case, the comparator enable signal CLK has a high voltage value such as 3 V or 5 V. In this case, the latch comparator 12 is enabled and the comparator output signal SCO is a function of the difference of the voltages provided to the first and the second input 16, 17 of the latch comparator 12. The further comparator output signal SCP has the inverse logical value with reference to the comparator output signal SCO.

Thus, the digital cell circuit 23 generates the second output signal OUT_V with the logical value 1, when the comparator output signal SCP and the further comparator output signal SCP have different logical values, and with the logical value 0, when the comparator output signal SCP and the further comparator output signal SCP have the same logical values. The second output signal OUT_V has a pulse after the point of time at which the comparator output signal SCP and the further comparator output signal SCP obtain different logical values.

The digital cell circuit 23 may generate the first output signal OUT as a function only of the comparator output signal SCP. The first output signal OUT has a pulse after the point of time at which the comparator output signal SCP obtains a pulse. For example, the first output signal OUT may be the inverse of the comparator output signal SCP.

When the comparator enable signal CLK becomes high, if the voltage at the first input terminal 16 is e.g. higher than the voltage at the second input terminal 17, the current through the first input transistor 71 will be higher than the current through the second input transistor 72, the comparator capacitor 80 on the comparator output 24 will be discharged faster than the second comparator capacitor 81 on the further comparator output 84. This means that the voltage on the comparator output 24 will roll off faster than voltage on the further comparator output 84. When the voltage on the comparator output 24 is equal to VDD−Vth, the positive feedback will be activated. Vth is the value of a threshold voltage of the p-channel MOSFETs. When the positive feedback is activated, the second and the third inverter transistor 77, 78 will be in a conducting state and first and the fourth inverter transistor 76, 79 will be in a non-conducting state. The comparator output 24 will be discharged to 0 V and the further comparator output 84 will be recharged to the supply voltage VDD in a very short period of time. The further comparator output 84 will stay at logic high (i.e. the supply voltage VDD) and the comparator output 24 will stay at logic low (0 V) until or as long as the comparator enable signal CLK stays high.

The latch comparator 12 is realized as a one-tail dynamic comparator.

Alternatively, instead of a one-tail dynamic comparator, the latch comparator 12 can use a double-tail or another topology. Alternatively, the latch comparator 12 can be implemented as a combination of a preamplifier with a latch structure at the output.

In an alternative, not shown embodiment, the latch comparator 12 may comprise an inverter that couples the output of the first inverter 73 to the comparator output 24. The latch comparator 12 may comprises an inverter that couples the output of the second inverter 74 to the further comparator output 84.

Figure 4:
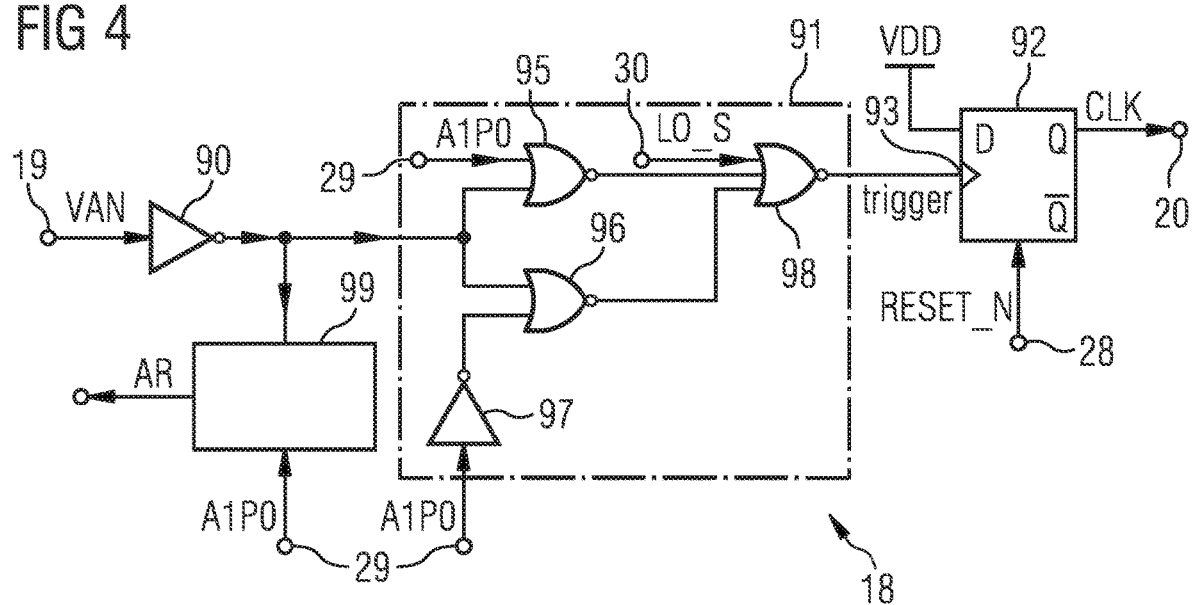
FIG. 4 shows an exemplary embodiment of a digital control circuit.

FIG. 4 shows an exemplary embodiment of the digital control circuit 18 that can be used for the realization of the avalanche diode arrangement 10 shown in FIGS. 1A and 1C. The digital control circuit 18 comprises an inverter 90 having an input connected to the node input 19 of the digital control circuit 18. Moreover, the digital control circuit 18 comprises a logic circuit 91 coupled on its input side to an output of the inverter 90. Additionally, the digital control circuit 18 comprise a flip-flop 92 coupled on its output side to the enable output 20 of the digital control circuit 18. The flip-flop 92 may be implemented as a D flip-flop. Thus, for example a Q-output of the flip-flop 92 is connected to the enable output 20. The output of the inverter 90 is coupled via the logic circuit 91 to a trigger input 93 of the flip-flop 92. The supply voltage terminal 75 is connected to a further input of the flip-flop 92. The supply voltage terminal 75 may be connected to the D-terminal of the flip-flop 92.

The first control input 28 of the digital control circuit 18 is connected to an additional input of the flip-flop 92. The additional input may be realized as a clear input. The logic circuit 91 is connected on its input side to the second and the third control input 29, 30 of the digital control circuit 18. The logic circuit 91 comprises a first and a second NOR gate 95, 96, each having an input connected to an output of the inverter 90. A further input of the first NOR gate 95 is connected to the second control input 29. A further input of the second NOR gate 96 is coupled via a further inverter 97 of the logic circuit 91 to the second control input 29. The outputs of the first and the second NOR gate 95, 96 are connected to two inputs of a further gate 98 of the logic circuit 91. The further gate 98 may be an OR gate. A third input of the further gate 98 is connected to the third control input 30. An output of the further gate 98 is connected to the input 93 of the flip-flop 92. The further gate 98 may be implemented by a further NOR gate followed by a further inverter.

Additionally, the digital control circuit 18 comprises a delay circuit 99 that is connected on its input side to the output of the inverter 90. Moreover, the delay circuit 99 is connected on its output side to the quenching circuit 13. For example, the delay circuit 99 may be connected to the control terminal of the reset switch 63. The delay circuit 99 has a further control input connected to the second control input 29. A control signal AR generated by the delay circuit 99 is a function of the control signal A1P0 and of an output signal of the inverter 90. The control signal AR may be the switch control signal SW2 shown in FIG. 2B. The delay circuit 99 realizes the dead time Δt3. The value Δt3 of the dead time is programmable.

In the case that a photon hits the avalanche diode 11, the node voltage VAN rises from 0 V to a higher value. Thus, an output signal at the inverter 90 switches from a high value to 0 V, i.e. from the logic value 1 to the logic value 0. The logic circuit 91 generates a delay. The output signal of the logic circuit 91 also switches from one logical value to another logical value, for example from the logic value 0 before the first point of time t1 to the logic value 1 after the first point of time t1. The output signal of the logic circuit 91 is provided to the input 93 of the flip-flop 92. The flip-flop 92 generates the comparator enable signal CLK. Thus, the digital control circuit 18 generates the comparator enable signal CLK with the digital delay time Δt as a response to a photon provided to the avalanche diode 11.

A pulse of the comparator enable signal CLK is only generated, when a rise of the node voltage VAN is higher than a predetermined threshold. The predetermined threshold is the threshold of the inverter 90. Advantageously, noise in the node voltage VAN does not trigger a pulse of the comparator enable signal CLK.

In the digital control circuit 18, at the beginning of a measurement cycle, the output of the D flip-flop 92 is reset to zero (the comparator enable signal CLK=0).

In the active reset mode, the signal A1P0 is set to high. This means that the flip-flop 92 can be triggered by the further control signal LO_S through the further gate 98, or by the node voltage VAN through the logic gates comprising the inverter 90, the NOR gate 96 and the further gate 98. During the measurement cycle when the further control signal LO_S is low, if a photon hits the SPAD 11, the node voltage VAN will go to high. The output of the inverter 90 will be low. The output of the NOR gate 96 will go to high and after passing through the further gate 98, trigger will go to high and also the comparator enable signal CLK.

If there was no event during a measurement cycle (the node voltage VAN is low all the time), when the further control signal LO_S goes back to high state at the end of the measurement cycle, the comparator enable signal CLK will be set to high.

In the passive reset mode, the signal A1P0 is set to zero. Now the flip-flop 92 can be triggered by the further control signal LO_S input through the further gate 98 or by the node voltage VAN through the logic gates 90, 95, 98. The procedure is the same like in active reset mode.

The control signal AR goes to the active/passive quenching circuit 13. If the signal A1P0 is high, after an event, the programmable dead time block will activate the control signal AR which sets the reset switch 63 in a conducting state in FIG. 2C.

Alternatively, the further gate 98 of the logic circuit 91 is an AND gate instead of an OR gate.

Alternatively, the logic circuit 91 may be realized using NAND gates and inverters or a combination of NOR gates, NAND gates and inverters.

Figure 5A:
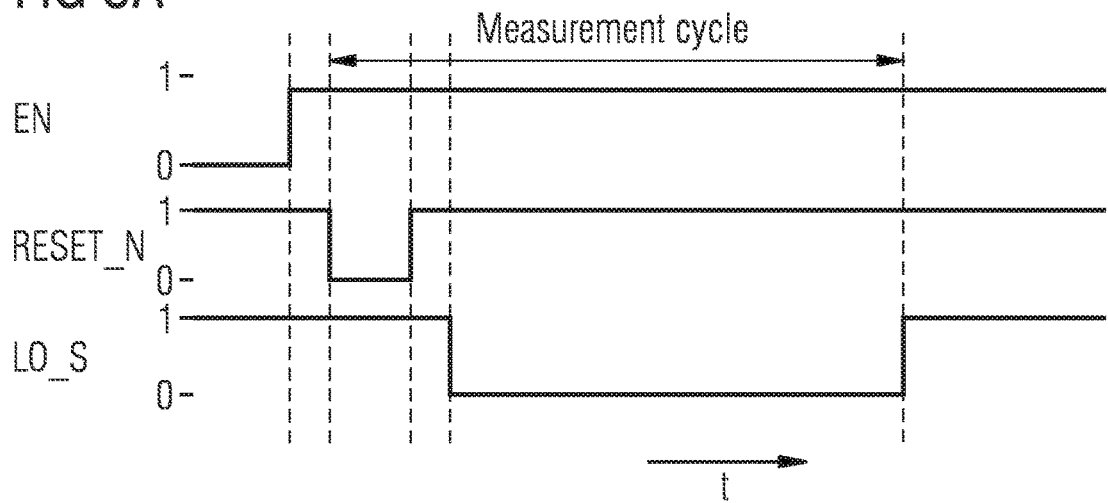

FIG. 5A shows an exemplary embodiment of signals of the embodiments of the avalanche diode arrangement 10 described above. The signals are shown as a function of the time t. A negative pulse of the reset signal RESET_N starts the measurement cycle.

The further control signal LO_S also shows a negative pulse starting after the pulse of the reset signal RESET_N and ending at the end of a measurement cycle.

As shown in FIG. 5A, a measurement cycle procedure comprises:
  The enable signal EN should be 1.
  When the reset signal RESET_N=0, the outputs of the latch comparator 12 are set to 00 state. Also the first output signal OUT=0 and the second output signal OUT_V=0.
  When the further control signal LO_S becomes logical 0, the latch comparator 12 is ready for comparison. When the SPAD 11 triggers, the second output signal OUT_V becomes logical 1 and the measurement cycle can be finished (LO_S goes back to 1).
  If the first output signal OUT was 0, the bias voltage VHV is increased and a further measurement cycle is performed.
  If the first output signal OUT was 1, the measurement is stopped (the enable signal EN goes to 0).

Figure 5B:
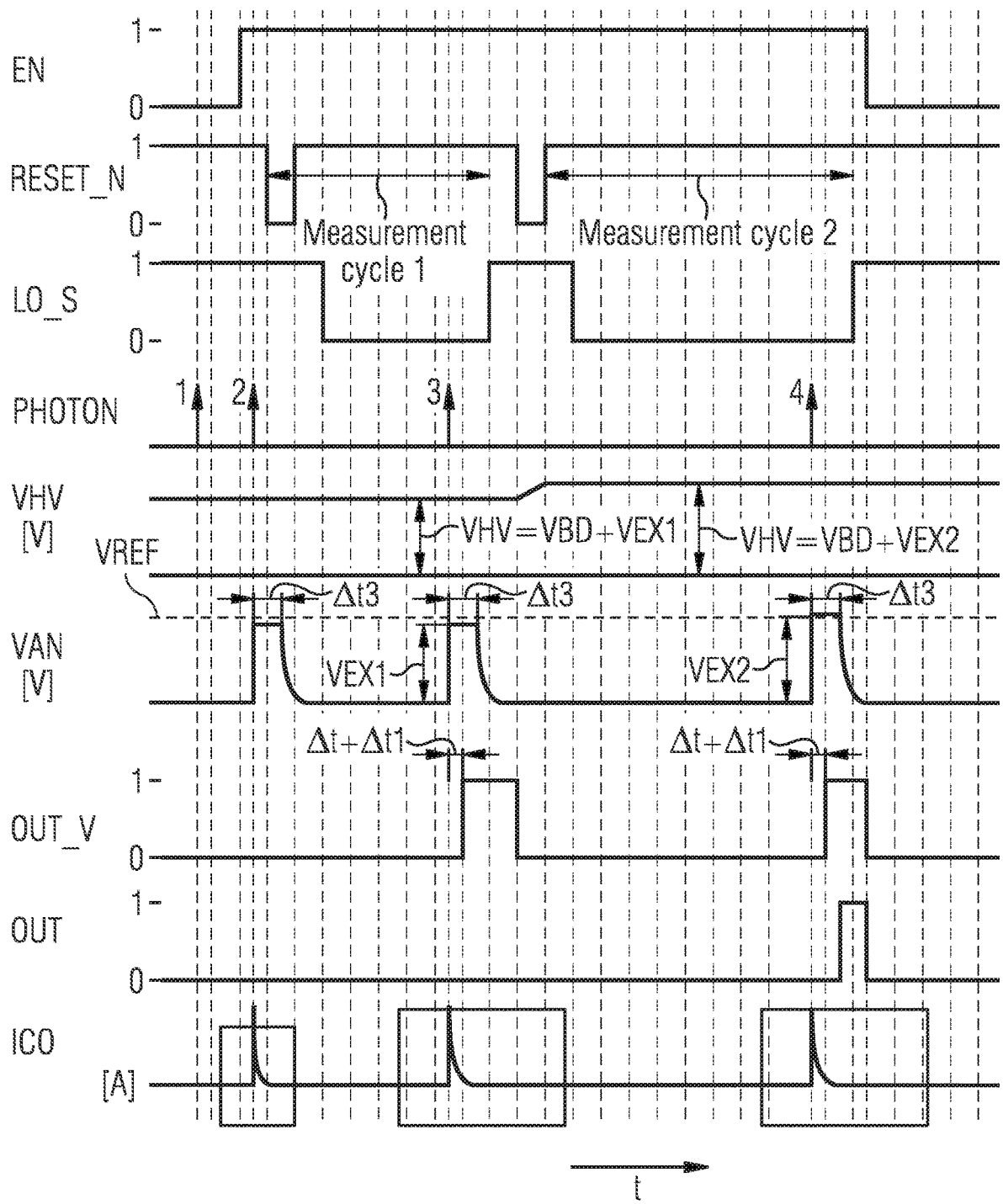

FIG. 5B shows a further exemplary embodiment of signals of the avalanche diode arrangement 10 that is a further development of the embodiments of the signals shown above. A first and a second measurement cycle are shown in FIG. 5B. The first and the second measurement cycle are each started with a negative pulse of the reset signal RESET_N and are stopped with a rise of the further control signal LO_S. A first photon marked with 1 does not provide any signal, since the avalanche diode arrangement 10 is not enabled by the enable signal EN. A second photon marked with 2 causes an increase of the node voltage VAN and of a current consumption ICO. However, since the second photon hits the avalanche diode 11 outside any measurement cycle, the first and the second output signals OUT, OUT_V do not show a pulse. The latch comparator 12 does not contribute to the current consumption ICO at the second photon.

A third photon hits the avalanche diode 11 during the first measurement cycle and causes a rise of the node voltage VAN and of the current consumption ICO and also triggers a pulse in the second output signal OUT_V. Since the latch comparator 12 and the SPAD 11 consumes current, the current consumption ICO caused by the third photon is higher than the current consumption ICO caused by the second photon. Since the value of the node voltage VAN is less than the value of the reference voltage VREF, the not-shown comparator output voltage SCO and the first output voltage OUT of the digital cell circuit 23 do not show a pulse.

During the second measurement cycle the fourth photon hits the avalanche diode 11 generating a pulse in the first and the second output signal OUT, OUT_V. The pulse in the output signal OUT is generated, since the node voltage VAN has a value higher than the reference voltage VREF. After the end of the first measurement cycle and before the start of the second measurement cycle, the bias voltage VHV is increased by a predetermined voltage step. The control circuit 46 may store the information about the bias voltage VHV in the memory 52. Thus, the avalanche diode arrangement 10 can use the value of the bias voltage VHV for measurements in a measurement phase, wherein this value is determined in a calibration phase using a series of the measurement cycles, described in FIGS. 1B, 1D and 5A to 5C. The measurement phase follows the calibration phase.

In FIG. 5B, a timing diagram in the active reset mode is shown.
  Photon 1: When the enable signal EN=0, the avalanche diode arrangement 10 is off, the SPAD 11 does not fire.
  Photon 2: The avalanche diode 11 fires because the enable signal EN=1, but the latch comparator 12 does not trigger because the further control signal LO_S=1. During this time the reset signal RESET_N goes to 0, the comparator output signal SCO, the first output signal OUT and the second output signal OUT_V are set to zero. The current consumption ICO comes only from the SPAD triggering.
  Photon 3: The SPAD 11 has fired and the node voltage VAN is frozen (active reset mode) for the dead time Δt3 defined by the digital control circuit 18. When the latch comparator 12 latches, the second output signal OUT_V goes to 1 and it stays 1 until the reset signal RESET_N becomes 0 again. When the second output signal OUT_V is detected one can read the value of the first output signal OUT. Because the first output signal OUT=0 (VAN<VREF), another measurement cycle is performed. The current consumption ICO is now higher comparing to case of Photon 2, because now the latch comparator 12 also consumes power.

Photon 4: Between two measurement cycles the bias voltage VHV has been increased. After the second measurement cycle the first output signal OUT=1, which means that the present value of the excess voltage VHV is high enough for desired excess voltage bias.

After this one can turn off the avalanche diode arrangement 10 (the enable signal EN=0) until next time when one wants to recalibrate the VHV voltage again.

FIG. 5C shows a further exemplary embodiment of signals of the avalanche diode arrangement 10 as a function of the time t that is a further development of the embodiments of the signals shown above. The calibration phase of the avalanche diode arrangement 10 comprises a series of measurement cycles, as illustrated in FIG. 5C. At this simulation, a regular pattern of photons is assumed. The bias voltage VHV starts at a low voltage value, for example 0 V. At a region 1, the value of the bias voltage VHV is low such that the node voltage VAN remains at 0 or only shows a small value after a hit of a photon. In region 1, the node voltage VAN has such a low value that the inverter 90 of the digital control circuit 18 does not change its output value. Thus, the second output signal OUT_V only shows short pulses arising from the pulses of the further control signal LO_S. The value of the bias voltage VHV is increased after each pulse of the second output signal OUT_V.

In region 2, the value of the bias voltage VHV is higher than in region 1. In region 2, the node voltage VAN is sufficient to change the signal at the output of the inverter 90 after a hit of a photon on the avalanche diode 11. Thus, the second output signal OUT_V has longer pulses in comparison to region 1. Since the node voltage VAN is still less than the reference voltage VREF, the digital cell circuit 23 does not generate pulses of the first output signal OUT. However, the bias voltage VHV is increased step by step after each end of a measurement cycle.

In region 3, the node voltage VAN has such a high value that the node voltage VAN is higher than the reference voltage VREF and thus a pulse in the not shown comparator output signal SCO and a pulse in the first output signal OUT is generated. Thus, after the pulse of the first output signal OUT, the bias voltage VHV is kept constant and will not be further increased.

In FIG. 5C, a measurement or calibration algorithm is illustrated. The bias voltage VHV starts with a low value. This value can be the lowest possible value of the breakdown voltage that the SPAD 11 can have. Alternatively, this value is 0 V. The bias voltage VHV starts with the predetermined low value and is increased by a constant step value after each measurement cycle unless a pulse of the first output signal OUT is detected. In case of a pulse of the first output signal OUT, the increase of the bias voltage VHV is stopped. The calibration phase is finished.

Region 1: The bias voltage VHV may be smaller or higher than the breakdown voltage VBD (VHV<VBD or VHV>VBD); however, the node voltage VAN is not high enough to trigger the digital control circuit 18. Thus, the latch comparator 12 will trigger at the end of the measurement cycle (when the further control signal LO_S becomes high again). The second output signal OUT_V will be high and the first output signal OUT will be low. During the time when a further reset signal RESET=0, the bias voltage VHV is increased for one voltage step. The further reset signal RESET may be equal to the reset signal RESET_N.

Region 2: The node voltage VAN is high enough to trigger the digital control circuit 18, the latch comparator 12 will trigger as soon as a first photon hits the SPAD 11. The second output signal OUT_V will be high and the first output signal OUT will be low. During the time when the further reset signal RESET=0, the bias voltage VHV is increased for one voltage step.

Region 3: VHV>VBD+VEX, the comparator output signal SCO and both outputs signals OUT_V and OUT of the digital cell circuit 23 will be high. This will be the optimal value of the bias voltage VHV. Thus, the calibration phase stops and the measurement phase may start using the bias voltage VHV with the value determined in the calibration phase.

Advantageously, the avalanche diode arrangement 10 only comprises one comparator. The avalanche diode arrangement 10 may be free of a second comparator. The avalanche diode arrangement 10 uses exactly one reference voltage. The reference voltage VREF may be provided by a reference circuit generator (not-shown in FIG. 1A). Alternatively, more reference voltages can exist with some programmability. Thus, one can choose between different reference voltages.

Alternatively, the avalanche diode arrangement 10 may comprise a second comparator.

Advantageously, the avalanche diode arrangement 10 does not have a static power consumption, since the comparator is implemented as a latch comparator 12. The avalanche diode arrangement 10 is free of a digital-to-analog converter. A bandgap reference 44 can be used. The avalanche diode arrangement 10 may be free of a digital filter. The avalanche diode arrangement 10 realizes an active and passive reset circuit functionality.

Figure 6:
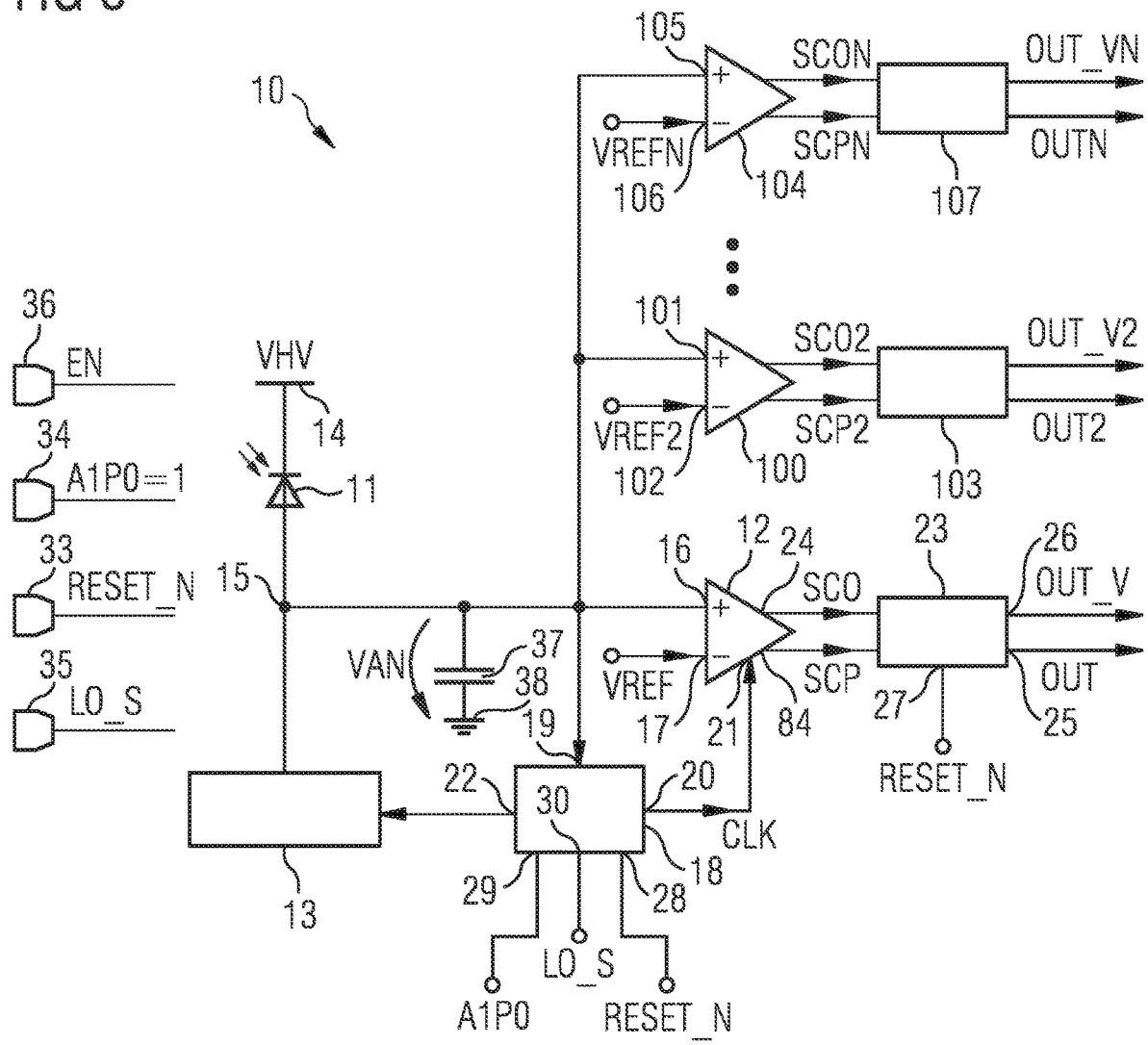
FIG. 6 shows a further exemplary embodiment of an avalanche diode arrangement.

FIG. 6 shows a further exemplary embodiment of the avalanche diode arrangement 10 that is a further development of the above shown embodiments. The avalanche diode arrangement 10 comprises the latch comparator 12 and at least a second latch comparator 100. The second latch comparator 100 comprises a first input 101 coupled to the first node 15. The first input 101 of the second latch comparator 100 may be directly and permanently connected to the first node 15. Moreover, the second latch comparator 100 comprises a second input 102. The first input 101 may be realized as a non-inverting input and the second input 102 of the second latch comparator 100 may be realized as an inverting input (or vice versa). The latch comparator 12 and the second latch comparator 100 may form a window comparator. The latch comparator 12 may be named first latch comparator. The digital cell circuit 23 may be named first digital cell circuit. The second latch comparator 100 may be realized such as the latch comparator 12.

The avalanche diode arrangement 10 comprises a second digital cell circuit 103 having a first input coupled to a comparator output of the second latch comparator 100. The first input of the second digital cell circuit 103 may be directly and permanently connected to the comparator output of the second latch comparator 100. The second digital cell circuit 103 may have a second input coupled to a further comparator output of the second latch comparator 103. The second input of the second digital cell circuit 103 may be directly and permanently connected to the further comparator output of the second latch comparator 100. The second digital cell circuit 103 may be implemented such as the digital cell circuit 23. The second digital cell circuit 103 has a first output. Moreover, the second digital cell circuit 103 may have a second output and a control input.

The enable output 20 of the digital control circuit 18 may be connected to an enable input of the second latch comparator 100. The first terminal 33 of the avalanche diode arrangement 10 may be connected to a not shown control input of the second digital cell circuit 103.

The avalanche diode arrangement 10 comprises a number N of the latch comparators 12, 100, 104. The number N may optionally be one, two or more than two. In the example shown in FIG. 6, the number N is equal to three. Thus, the avalanche diode arrangement 10 comprises an Nth latch comparator 104. The Nth latch comparator 104 is realized such as the latch comparator 12. Each of the number N of latch comparators 12, 100, 104 comprises a first input 16, 101, 105 coupled to the first node 15. The first inputs 16, 101, 105 of the number N of latch comparators 12, 100, 104 may be directly and permanently connected to the first node 15. Moreover, each of the number N of latch comparators 12, 100, 104 comprises a second input 17, 102, 106. The first inputs 16, 101, 105 may be realized as a non-inverting input and the second inputs 17, 102, 106 of the number N of latch comparators 12, 100, 104 may be realized as inverting inputs (or vice versa).

The enable output 20 of the digital control circuit 18 may be connected to an enable input of each of the number N of latch comparators 12, 100, 104.

The avalanche diode arrangement 10 comprises the number N of digital cell circuits 23, 103, 107. Thus, the avalanche diode arrangement 10 comprises a Nth digital cell circuit 107 having a first input coupled to a comparator output of the Nth latch comparator 104. The first input of the Nth digital cell circuit 107 may be directly and permanently connected to the comparator output of the Nth latch comparator 104. The Nth digital cell circuit 107 may have a second input coupled to a further comparator output of the Nth latch comparator 104. The second input of the Nth digital cell circuit 107 may be directly and permanently connected to the further comparator output of the Nth latch comparator 104.

The node voltage VAN is applied to the first input 101 of the second latch comparator 100. A second reference voltage VREF2 is provided to the second input 102 of the second latch comparator 100. The second reference voltage VREF2 is different from the reference voltage VREF. The reference voltage VREF may be called first reference voltage. The node voltage VAN is applied to the first input 16, 101, 105 of each of the number N of latch comparators 12, 100, 104. An Nth reference voltage VREFN is provided to the second input 106 of the Nth latch comparator 104. The number N of reference voltages VREF, VREF2, VREFN are provided to the second inputs 17, 102, 106 of the number N of latch comparators 12, 100, 104. The number N of reference voltages VREF, VREF2, VREFN are different from each other.

The second latch comparator 100 generates a second comparator output signal SCO2 at the comparator output as a function of a comparison of the voltage tapped at the first input 101 and the voltage tapped at the second input 102 of the second latch comparator 100. Thus, the second comparator output signal SCO2 is a function of a comparison of the node voltage VAN and of the second reference voltage VREF2. The second latch comparator 100 generates a second further comparator output signal SCP2 at the further comparator output as a function of a comparison of the voltage tapped at the first input 101 and the voltage tapped at the second input 102 of the second latch comparator 100. Thus, the second further comparator output signal SCP2 is a function of a comparison of the node voltage VAN and of the second reference voltage VREF2.

The second reference voltage VREF2 may be higher than the reference voltage VREF. In case a photon hits the avalanche diode 11, the latch comparator 12 and the second latch comparator 100 compare the anode voltage VAN with the reference voltage VREF and the second reference voltage VREF2. The desired or predetermined value of the anode bias voltage VAN may be out of the range:

$$VREF<VAN<VREF2$$

In case the anode voltage VAN is in this range VREF<VAN<VREF2, the bias voltage VHV is kept constant. In case the anode voltage VAN is larger than the second reference voltage VREF2, the bias voltage VHV is reduced. In case the anode voltage VAN is lower than the reference voltage VREF, the bias voltage VHV is increased.

In case a photon hits the avalanche diode 11, the node voltage VAN is equal to the excess bias voltage VEX. Thus, in case a photon hits the avalanche diode 11, the latch comparator 12 and the second latch comparator 100 compare the excess bias voltage VEX with the reference voltage VREF and the second reference voltage VREF2. The desired or predetermined value of the excess bias voltage VEX may be out of the range:

$$VREF<VEX<VREF2$$

In case the measured excess bias voltage VEX is in this range VREF<VEX<VREF2, the bias voltage VHV is kept constant. In case the measured excess bias voltage VEX is larger than the second reference voltage VREF2, the bias voltage VHV is reduced. In case the measured excess bias voltage VEX is lower than the reference voltage VREF, the bias voltage VHV is increased. The reference voltage VREF and the second reference voltage VREF2 define a window for the desired or predetermined value of the excess bias voltage VEX. The avalanche diode arrangement 10 uses one window to monitor the anode voltage VAN respectively the excess bias voltage VEX.

The comparator enable signal CLK is provided from the digital control circuit 18 via the enable output 20 to the enable input of the second latch comparator 100. The second comparator output signal SCO2 is provided to the first input of the second digital cell circuit 103. The second digital cell circuit 103 generates a first output signal OUT2 at the first output. The first output signal OUT2 is a function of the second comparator output signal SCO2. A second output signal OUT_V2 is generated at the second output of the second digital cell circuit 103. The second output signal OUT_V2 indicates a valid hit of a photon, for example a hit of a photon on the avalanche diode 11 during a measurement cycle. The second output signal OUT_V2 may be independent from the second comparator output signal SCO2.

The second further comparator output signal SCP2 is provided to the second input of the second digital cell circuit 103. The second digital cell circuit 103 determines the values of the first and the second output signal OUT2, OUT_V2 as a function of the second comparator output signal SCO2 and the second further comparator output signal SCP2.

After the second point of time t2 (as shown in FIG. 1B) the second latch comparator 100 generates the second comparator output signal SCO2 and provides it to the second digital cell circuit 103. The second digital cell circuit 103 generates the first output signal OUT2 with a first logical value, for example with the value 1 in case the node voltage VAN is higher than the second reference voltage VREF2. Similarly, the second digital cell circuit 103 generates the first output signal OUT2 with a second logical value, for example the value of 0 in case that the node voltage VAN is less than the second reference voltage VREF2.

The operation of a further latch comparator such as the Nth latch comparator 104 is such as the operation of the latch comparator 12 and of the second latch comparator 100. The operation of a further digital cell circuit such as the Nth digital cell circuit 107 is such as the operation of the digital cell circuit 23 and of the second digital cell circuit 103.

Advantageously, the avalanche diode arrangement 10 monitors the excess bias voltage VEX of the SPAD 11 and compares it with the reference voltage VREF, the second reference voltage VREF2 and optionally with further reference voltages such as the Nth reference voltage VREFN. The avalanche diode arrangement 10 is configured to set the bias voltage VHV using a window approach. When the number N is higher than two, the anode voltage VAN can be monitored using more than one window.

Also the avalanche diode arrangement 10 shown in FIG. 1C may comprise the number N of latch comparators 12, 100, 104 and the number N of digital cell circuits 23, 103, 107 with N larger than one.

In general, the term "coupled" may be replaced by "connected", "directly connected" or "directly and permanently connected". The term "connected" may be replaced by "coupled", "directly connected" or "directly and permanently connected".

The invention claimed is:

1. An avalanche diode arrangement, comprising
an avalanche diode having an anode connected to a first node and a cathode connected to a first voltage terminal,
a latch comparator with a first input connected to the first node, a second input for receiving a reference voltage and an enable input for receiving a comparator enable signal,
a quenching circuit connected to the first node; and
a digital control circuit having a node input connected to the first node, and an enable output connected to the enable input of the latch comparator.

2. The avalanche diode arrangement according to claim 1, wherein the digital control circuit is configured to generate the comparator enable signal as a function of a node voltage that is tapped at the first node.

3. The avalanche diode arrangement according to claim 1, wherein the digital control circuit comprises an inverter with an input coupled to the node input and an output coupled to the enable output.

4. The avalanche diode arrangement according to claim 3, wherein the digital control circuit comprises a flip-flop with an input coupled to an output of the inverter and an output coupled to the enable output.

5. The avalanche diode arrangement according to claim 1, comprising a voltage divider coupling the first node to a second voltage terminal, wherein a divider tap of the voltage divider is coupled to the first input of the latch comparator.

6. The avalanche diode arrangement according to claim 1, wherein the latch comparator configured to generate a comparator output signal as a function of a comparison of the voltages at the first and the second input of the latch comparator in case of a first logical value of the comparator enable signal and to generate the comparator output signal with a constant value in case of a second logical value of the comparator enable signal.

7. The avalanche diode arrangement according to claim 1, wherein the latch comparator comprises
a first input transistor with a control terminal coupled to the first input of the latch comparator,
a second input transistor with a control terminal coupled to the second input of the latch comparator, and
a current source transistor with a control terminal coupled to the enable input of the latch comparator and with a first terminal coupled to a first terminal of the first input transistor and a first terminal of the second input transistor.

8. The avalanche diode arrangement according to claim 1, wherein the latch comparator comprises a first control transistor having a control terminal coupled to the enable input of the latch comparator and a first terminal coupled to a comparator output of the latch comparator.

9. The avalanche diode arrangement according to claim 1, comprising
a bias voltage generator coupled to the first voltage terminal and
a control circuit having a first input coupled to a comparator output of the latch comparator and a control output coupled to a control input of the bias voltage generator.

10. The avalanche diode arrangement according to claim 9, wherein the bias voltage generator and the control circuit are configured to increase a bias voltage generated by the bias voltage generator in case a comparator output signal of the latch comparator indicates that a voltage at the first input of the latch comparator is less than the reference voltage.

11. The avalanche diode arrangement according to claim 9, comprising a digital cell circuit having a first input coupled to the comparator output of the latch comparator and a first output coupled to the first input of the control circuit, wherein the digital cell circuit is configured to generate a first output signal as a function of the comparator output signal and to provide the first output signal to the first input of the control circuit.

12. The avalanche diode arrangement according to claim 1,
wherein the quenching circuit comprises a quenching resistor coupled to the first node and to a second voltage terminal.

13. A method for controlling an avalanche diode arrangement, comprising
generating a node voltage at a first node that is coupled via an avalanche diode to a first voltage terminal and via a quenching circuit to a second voltage terminal,
providing the node voltage or a voltage derived from the node voltage to a first input of a latch comparator,
providing a reference voltage to a second input of the latch comparator,
providing a comparator enable signal to an enable input of the latch comparator, and
generating a comparator output signal as a function of the voltages at the first and the second input of the latch comparator and the comparator enable signal,
wherein the node voltage is provided to a node input of a digital control circuit, and the digital control circuit generates the comparator enable signal as a function of the node voltage.

14. The method according to claim 13,
wherein the latch comparator generates the comparator output signal as a function of a comparison of the voltages at the first and the second input of the latch comparator in case of a first logical value of the comparator enable signal and generates the comparator output signal with a constant value in case of a second logical value of the comparator enable signal.

* * * * *